(12) United States Patent  (10) Patent No.: US 8,958,231 B2
Matsubayashi  (45) Date of Patent: Feb. 17, 2015

(54) MEMORY DEVICE INCLUDING FIRST TO SEVENTH TRANSISTORS

(75) Inventor: Daisuke Matsubayashi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 213 days.

(21) Appl. No.: 13/488,507

(22) Filed: Jun. 5, 2012

(65) Prior Publication Data

US 2012/0314470 A1 Dec. 13, 2012

(30) Foreign Application Priority Data

Jun. 9, 2011 (JP) ................................ 2011-128974

(51) Int. Cl.
G11C 15/04 (2006.01)
(52) U.S. Cl.
CPC .............. G11C 15/046 (2013.01); G11C 15/04 (2013.01)
USPC ...................... 365/72; 365/49.17; 365/189.07
(58) Field of Classification Search
USPC .................... 365/72, 49.17, 189.07
See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

(Continued)

*Primary Examiner* — Richard Elms
*Assistant Examiner* — Mohammed A Bashar
(74) *Attorney, Agent, or Firm* — Fish & Richardson P.C.

(57) ABSTRACT

A memory cell includes a first transistor controlling writing of the first date by being in an on state, and holding of the first data by being in an off state, a second transistor in which a potential of one of a source and a drain is a potential of the second data and a potential of a gate is a potential of the first data, and a third transistor which has a conductivity type opposite to that of the second transistor, which has one of a source and a drain electrically connected to the other of the source and the drain of the second transistor, and in which a potential of a gate is a potential of the first data.

6 Claims, 15 Drawing Sheets

(56) References Cited

U.S. PATENT DOCUMENTS

| | | | |
|---|---|---|---|
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0103120 A1* | 5/2011 | Hong et al. | 365/49.17 |
| 2011/0285442 A1* | 11/2011 | Saito | 327/176 |

FOREIGN PATENT DOCUMENTS

| | | |
|---|---|---|
| JP | 60-198861 A | 10/1985 |
| JP | 63-096799 A | 4/1988 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2004-295967 A | 10/2004 |
| WO | WO-2004/114391 | 12/2004 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "Spinel,YBFE2O4, and YB2FE3O7 Types of Structures for Compounds in the In2O3 and Sc2O3—A2O3—BO Systems [A; Fe, Ga, or Al; B: Mg, Mn, Fe, Ni, Cu,or Zn] At Temperatures Over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

(56) References Cited

OTHER PUBLICATIONS

Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Kanno.H et al., "White Stacked Electrophosphorecent Organic Light-Emitting Devices Employing MOO3 As a Charge-Generation Layer", Adv. Mater. (Advanced Materials), 2006, vol. 18, No. 3, pp. 339-342.
Lee.H et al., "Current Status of, Challenges to, and Perspective View of AM-OLED", IDW '06 : Proceedings of the 13th International Display Workshops, Dec. 7, 2006, pp. 663-666.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hirao.T et al., "Novel Top-Gate Zinc Oxide Thin-Film Transistors (ZnO TFTs) for AMLCDS", Journal of The SID, 2007, vol. 15, No. 1, pp. 17-22.
Park.S et al., "Challenge to Future Displays: Transparent AM-OLED Driven by PEALD Grown ZnO TFT", IMID '07 Digest, 2007, pp. 1249-1252.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Miyasaka.M, "SUFTLA Flexible Microelectronics on Their Way to Business", SID Digest '07 : SID International Symposium Digest of Technical Papers, 2007, vol. 38, pp. 1673-1676.
Kurokawa.Y et al., "UHF RFCPUS on Flexible and Glass Substrates for Secure RFID Systems", Journal of Solid-State Circuits , 2008, vol. 43, No. 1, pp. 292-299.
Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Park.J et al., "Amorphous Indium—Gallium—Zinc Oxide TFTs and Their Application for Large Size AMOLED", AM-FPD '08 Digest of Technical Papers, Jul. 2, 2008, pp. 275-278.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Nowatari.H et al., "60.2: Intermediate Connector With Suppressed Voltage Loss for White TANDEM OLEDs", SID Digest '09 : SID International Symposium Digest of Technical Papers, May 31, 2009, vol. 40, pp. 899-902.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Lee.M et al., "15.4:Excellent Performance of Indium—Oxide—Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors or AMOLED Back-Plane", SID Digest '09 : SID International Symposium Digest of Technical Papers, May 31, 2009, pp. 280-283.
Kikuchi.H et al., "39.1:Invited Paper:Optically Isotropic Nano-Structured Liquid Crystal Composited for Display Applications", SID Digest '09 : SID International Symposium Digest of Technical Papers, May 31, 2009, pp. 578-581.
Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.
Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.
Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.
Osada.T et al., "Development of Driver-Integrated Panel Using Amorphous In—Ga—Zn—Oxide TFT", AM-FPD '09 Digest of Technical Papers, Jul. 1, 2009, pp. 33-36.
Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.
Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Park.J et al., "High performance amorphous oxide thin film transistors with self-aligned top-gate structure", IEDM 09: Technical Digest of International Electron Devices Meeting, Dec. 7, 2009, pp. 191-194.
Nakamura.M, "Synthesis of Homologous Compound with New Long-Period Structure", NIRIM Newsletter, Mar. 1, 1995, vol. 150, pp. 1-4.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Orita.M et al., "Amorphous transparent conductive oxide InGaO3(ZnO)m (m <4):a Zn4s conductor", Philosophical Magazine, 2001, vol. 81, No. 5, pp. 501-515.
Janotti.A et al., "Oxygen Vacancies In ZnO", Appl. Phys. Lett. (Applied Physics Letters) , 2005, vol. 87, pp. 122102-1-122102-3.
Clark.S et al., "First Principles Methods Using CASTEP", Zeitschrift fur Kristallographie, 2005, vol. 220, pp. 567-570.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.
Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

(56) References Cited

OTHER PUBLICATIONS

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced At Room Temperature", Appl. Phys. Lett. (Applied Physics Letters) , Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

\* cited by examiner

| Dm | Dsch | 212 | 213 | Vx | 214 |
|---|---|---|---|---|---|
| 0 | 0 | OFF | ON | H | ON |
| 1 | 0 | ON | OFF | L | OFF |
| 0 | 1 | OFF | OFF | L | OFF |
| 1 | 1 | ON | OFF | H | ON |

| Dm | Dsch | 312 | 313 | Vx |
|---|---|---|---|---|
| 0 | 0 | OFF | ON | H |
| 1 | 0 | ON | OFF | L |
| 0 | 1 | OFF | OFF | L |
| 1 | 1 | ON | OFF | H |

| Dm | Dsch | 412 | 413 | Vx1 | 414 | 415 | 416 | Vx2 | 417 |
|---|---|---|---|---|---|---|---|---|---|
| 0 | 0 | OFF | ON | H | ON | OFF | OFF | L | OFF |
| 1 | 0 | ON | OFF | L | OFF | OFF | ON | L | OFF |
| 0 | 1 | OFF | OFF | L | OFF | ON | OFF | H | ON |
| 1 | 1 | ON | OFF | H | ON | OFF | ON | L | OFF |

● In
☾ Sn
☽ Zn
● O

● : In
○ : Ga or Zn
● : O

● : In
○ : Ga
○ : Zn
● : O

MEMORY DEVICE INCLUDING FIRST TO SEVENTH TRANSISTORS

BACKGROUND OF THE INVENTION

1. Field of the Invention

One embodiment of the present invention relates to a memory device.

2. Description of the Related Art

In recent years, memory devices capable of rewriting data have been developed.

As an example of such memory devices, a content addressable memory can be given.

The content addressable memory is a memory device which can not only rewrite data but also compare search data with data stored in a memory cell.

The content addressable memory is used for a set-associative cache memory, for example. The set-associative structure is a data storage structure including a plurality of tags, and a content addressable memory is used as each of the tags. The use of the content addressable memory for the cache memory can increase the data communication speed between a CPU and the cache memory.

A memory cell in a content addressable memory includes, for example, a memory circuit which holds data and a plurality of comparison circuits which compare the data stored in the memory circuit (also referred to as storage data or data Dm) with search data (also referred to as data Dsch) (e.g., Patent Document 1).

In Patent Document 1, the memory circuit is an SRAM (static random access memory).

REFERENCE

Patent Document

[Patent Document 1] Japanese Published Patent Application No. 2004-295967

SUMMARY OF THE INVENTION

Conventional content addressable memories have a problem in that the circuit area in each memory cell is large. For example, in the content addressable memory disclosed in Patent Document 1, six transistors are included in a memory circuit, which leads to a large circuit area.

In addition, conventional content addressable memories have a problem in that the storage data holding period of a memory cell is short owing to leakage current of a transistor in an off state. For example, in a content addressable memory disclosed in Patent Document 1, data is lost owing to leakage current of a transistor, or the like, when power supply is stopped. Therefore, it is necessary to keep supplying power or to separately save data in a nonvolatile memory; in both cases, power consumption is inevitable.

An object of one embodiment of the present invention is to achieve at least one of a reduction in circuit area and a reduction in power consumption.

According to one embodiment of the present invention, a transistor which controls writing and holding of data in a memory cell and a transistor which is controlled to be in an on state or an off state in accordance with the value of storage data and the value of search data are used to form a memory cell having a function of storing data and also comparing the storage data with the search data to determine the content of the storage data. The memory cell has a reduced number of transistors, thereby reducing the circuit area.

In one embodiment of the present invention, a transistor with low off-state current is used as the above-described transistor which controls writing and holding of data; accordingly, leakage current of the transistor in an off state can be reduced and the data holding period of the memory cell can be increased.

One embodiment of the present invention is a memory device which includes a memory cell having a function of comparing a first data stored in the memory cell with a second data which is a search data, thereby determining a content of the first data. In the memory device, the memory cell includes a first transistor having an off-state current per micrometer of channel width of lower than or equal to 10 aA and controlling writing of the first data by being in an on state and holding of the first data by being in an off state, a second transistor in which a potential of one of a source and a drain is a potential of the second data and a potential of a gate is a potential of the first data, and a third transistor which has a conductivity type opposite to that of the second transistor, which has one of a source and a drain electrically connected to the other of the source and the drain of the second transistor, and in which a potential of a gate is a potential of the first data.

In the memory device of the above one embodiment of the present invention, the first transistor may include an oxide semiconductor layer in which a channel is formed.

With one embodiment of the present invention, the number of transistors in a memory cell can be reduced, whereby the circuit area can be reduced. Further, with one embodiment of the present invention, the data holding period of a memory cell can be increased, whereby power consumption can be reduced.

DETAILED DESCRIPTION OF THE INVENTION

Examples of embodiments describing the present invention will be described below with reference to the drawings. Note that it will be readily appreciated by those skilled in the art that details of the embodiments can be modified in various ways without departing from the spirit and scope of the invention. The invention is therefore not limited to the following description of the embodiments.

Note that the contents in different embodiments can be combined with one another as appropriate. In addition, the contents in different embodiments can be replaced with each other.

Further, the ordinal numbers such as "first" and "second" are used to avoid confusion between components and do not limit the number of components.
(Embodiment 1)

In this embodiment, an example of a memory device capable of comparing search data with stored data will be described.

An example of a memory device in this embodiment will be described with reference to FIG. 1.

Figure 1:
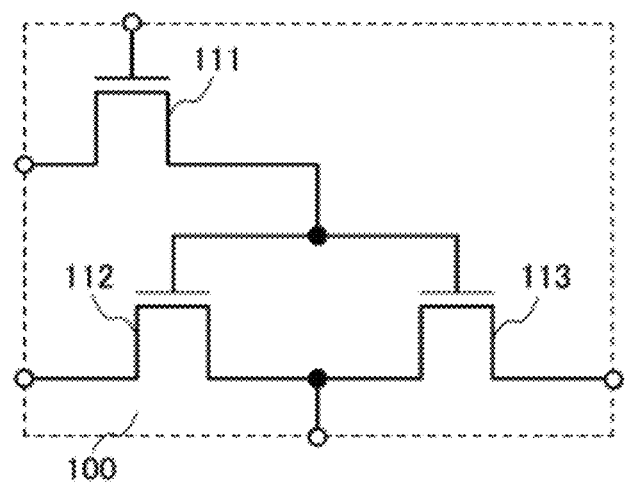
FIG. 1 illustrates an example of a memory device in Embodiment 1.

The memory device in FIG. 1 includes a memory cell 100.

The memory cell 100 has a function of comparing data Dm that is data stored in the memory cell 100 with data Dsch that is search data to determine the content of the data Dm.

The memory cell 100 includes a transistor 111, a transistor 112, and a transistor 113.

The transistor 111 has a function of controlling writing and holding of the data Dm.

For example, a transistor with low off-state current can be used as the transistor 111. In this case, the off-state current per micrometer of the channel width of the transistor 111 is lower than or equal to 10 aA ($1 \times 10^{-17}$ A), preferably lower than or equal to 1 aA ($1 \times 10^{-18}$ A), further preferably lower than or equal to 10 zA ($1 \times 10^{-20}$ A), further preferably lower than or equal to 1 zA ($1 \times 10^{-21}$ A), still further preferably lower than or equal to 100 yA ($1 \times 10^{-22}$ A).

An example of the transistor with low off-state current is a transistor in which a semiconductor layer where a channel is formed has a wider bandgap than silicon, for example, a bandgap of 2 eV or more, preferably 2.5 eV or more, and further preferably 3 eV or more. As the transistor having such a wide bandgap, a field effect transistor including an oxide semiconductor layer in which a channel is formed can be used, for example.

The transistor 112 is controlled to be in an on state (also referred to as state ON) or an off state (also referred to as state OFF) in accordance with the value of the data Dm and the value of the data Dsch.

The potential of one of a source and a drain of the transistor 112 is that of the data Dsch, and the potential of a gate of the transistor 112 is that of the data Dm. The gate of the transistor 112 is electrically connected to a source or a drain of the transistor 111, for example.

The transistor 113 is controlled to be in an on state or an off state in accordance with the value of the data Dm and the value of the data Dsch.

The potential of one of a source and a drain of the transistor 113 is that of inverted data of the data Dsch, and the potential of a gate of the transistor 113 is that of the data Dm.

For example, the other of the source and the drain of the transistor 113 is electrically connected to the other of the source and the drain of the transistor 112, and the gate of the transistor 113 is electrically connected to the source or the drain of the transistor 111.

Note that each of the transistors 112 and 113 can be, for example, a transistor including a semiconductor layer in which a channel is formed and which contains a semiconductor that belongs to Group 14 in the periodic table (e.g., silicon).

In the memory device in FIG. 1, the value of data representing the comparison result in the memory cell 100 is determined by the potential of a portion (also referred to as node) where the other of the source and the drain of the transistor 112 and the other of the source and the drain of the transistor 113 are connected to each other.

Note that the term "voltage" generally means a difference between potentials at two points (also referred to as a potential difference). However, in some cases, values of both a voltage and a potential are represented using volt (V) in a circuit diagram or the like, so that it is difficult to discriminate between them. Thus, in this specification, a potential difference between a potential at one point and a reference potential is sometimes referred to as a voltage at the point unless otherwise specified.

Next, as an example of a method for driving the memory device in this embodiment, an example of a method for driving the memory device illustrated in FIG. 1 will be described.

First, a data writing operation will be described. In the example of the method for driving the memory device illustrated in FIG. 1, the transistor 111 in the memory cell 100 is made to be in an on state.

At this time, the potential of the gates of the transistor 112 and the transistor 113, that is, the value of the data Dm is determined by a data signal. Thus, new data is written to the memory cell 100. After that, the transistor 111 is made to be in an off state; thus, the value of the data Dm is held. Here, for example, a binary digital signal whose level is switched between a high level (also referred to as potential H) and a low level (also referred to as potential L) is used as the data signal, and the potential of the high-level data signal is data 1 and the potential of the low-level data signal is data 0. The binary digital signal is not limited to this, and the potential of the high-level data signal may be data 0 and the potential of the low-level data signal may be data 1.

The potential of the one of the source and the drain of the transistor 112, that is, the value of the data Dsch is determined by a data signal.

Next, a data comparison operation will be described. Comparison between the data Dm and the data Dsch is conducted. At this time, the state of each of the transistor 112 and the transistor 113 is changed in accordance with the value of the data Dm and the value of the data Dsch. Accordingly, the value of the data Dm can be determined from the change. Note that before setting the value of the data Dsch, the potential at the portion where the other of the source and the drain of the transistor 112 and the other of the source and the drain of the transistor 113 are connected to each other is set to a value that is equal to that of the low-level data signal.

For example, in the case where the transistor 112 is an n-channel transistor and the transistor 113 is a p-channel transistor and the potential of the other of the source and the drain of the transistor 113 is that of inverted data of the data Dsch and when the value of the data Dm matches the value of the data Dsch, the potential at the portion where the other of the source and the drain of the transistor 112 and the other of the source and the drain of the transistor 113 are connected to each other can be set to a value that is equal to that of the high-level data signal. Thus, whether the value of the data Dm matches the value of the data Dsch can be determined by checking whether the value of the potential at the portion where the other of the source and the drain of the transistor 112 and the other of the source and the drain of the transistor 113 are connected to each other has changed.

In the above-described manner, the operation in the example of the method for driving the memory device illustrated in FIG. 1 is conducted.

As described with reference to FIG. 1, in the example of the memory device in this embodiment, the first to third transistors (e.g., the transistors 111 to 113) can form a memory cell in which data stored therein is compared with search data to determine the stored data.

In the example of the memory device in this embodiment, instead of using a memory device such as an SRAM, data is stored in a memory cell with the use of the first transistor, which can reduce the number of elements in the memory cell as compared with that in the conventional memory device, resulting in a reduction in the circuit area.

In the example of the memory device in this embodiment, use of the transistor with low off-state current as the first transistor can increase the data holding period without the need for an additional capacitor. Accordingly, the number of elements in the memory cell can be reduced, whereby the circuit area can be reduced. Further, power consumption can be reduced.

(Embodiment 2)

In this embodiment, an example of a memory device which can determine whether the stored data matches search data will be described.

Figures 2A, 2B:
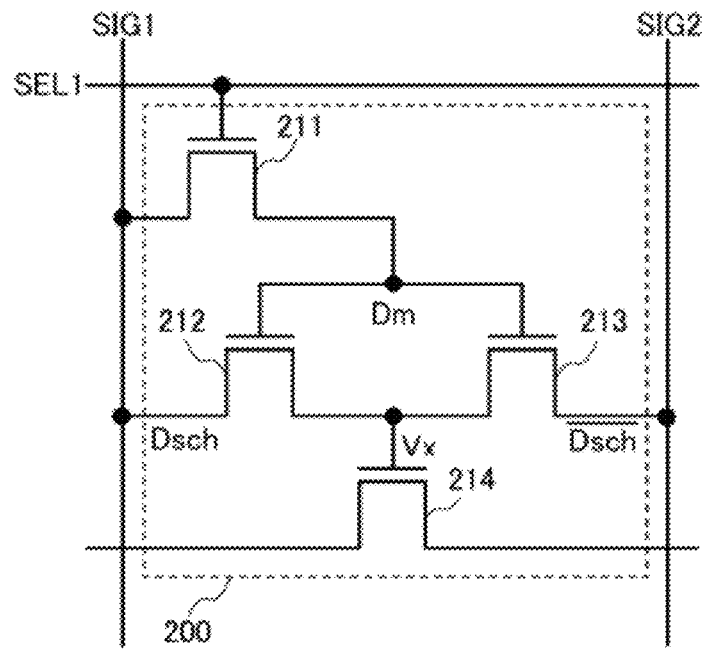
FIGS. 2A and 2B illustrate an example of a memory device in Embodiment 2.

A memory device illustrated in FIG. 2A includes a memory cell 200, a data signal line SIG1, a data signal line SIG2, and a selection signal line SEL1.

The memory cell 200 has a function of comparing data Dm that is data stored in the memory cell 200 with data Dsch that is search data to determine the content of the data Dm.

In addition, the memory cell 200 includes a transistor 211, a transistor 212, a transistor 213, and a transistor 214.

The transistor 211 has a function of controlling writing and holding of data to the memory cell 200.

One of a source and a drain of the transistor 211 is electrically connected to the data signal line SIG1, and a gate of the transistor 211 is electrically connected to the selection signal line SEL1.

For example, the transistor with low off-state current, which can be applied to the transistor 111 in Embodiment 1, can be used as the transistor 211.

The transistor 212 is controlled to be in an on state or an off state in accordance with the value of the data Dm and the value of the data Dsch.

One of a source and a drain of the transistor 212 is electrically connected to the data signal line SIG1, and a gate of the transistor 212 is electrically connected to the other of the source and the drain of the transistor 211. The potential of the one of the source and the drain of the transistor 212 is that of the data Dsch, and the potential of the gate of the transistor 212 is that of the data Dm. Note that the one of the source and the drain of the transistor 212 is not necessarily electrically connected to the data signal line SIG1, and the transistor 212 may be electrically connected to another data signal line that is different from the data signal line SIG1.

The transistor 213 is controlled to be in an on state or an off state in accordance with the value of the data Dm and the value of the data Dsch.

One of a source and a drain of the transistor 213 is electrically connected to the data signal line SIG2, the other of the source and the drain of the transistor 213 is electrically connected to the other of the source and the drain of the transistor 212, and a gate of the transistor 213 is electrically connected to the other of the source and the drain of the transistor 211. The potential of the one of the source and the drain of the transistor 213 is that of inverted data of the data Dsch, and the potential of the gate of the transistor 213 is that of the data Dm. Note that the one of the source and the drain of the transistor 213 is not necessarily electrically connected to the data signal line SIG2 and may be, for example, electrically connected to a wiring to which a predetermined potential is given.

The transistor 214 is controlled to be in an on state or an off state in accordance with the result of the comparison between the data Dm and the data Dsch.

A gate of the transistor 214 is electrically connected to the other of the source and the drain of the transistor 212 and the other of the source and the drain of the transistor 213.

For example, each of the transistors 212 to 214 can be the transistor that can be applied to the transistors 112 and 113.

Next, as an example of a method for driving the memory device in this embodiment, an example of a method for driving the memory device illustrated in FIG. 2A will be described. As an example here, the transistor 211, the transistor 212, and the transistor 214 are n-channel transistors, and the transistor 213 is a p-channel transistor.

First, a data writing operation will be described. In the example of the method for driving the memory device illustrated in FIG. 2A, the transistor 211 in the memory cell 200 is made to be in an on state by a selection signal input through the selection signal line SEL1.

At this time, the potential of the gates of the transistor 212 and the transistor 213, that is, the value of the data Dm is determined by a data signal input to the memory cell 200 through the data signal line SIG1. Thus, new data is written to the memory cell 200. After that, the transistor 211 is made to be in an off state; thus, the value of the data Dm is held. Note that here, for example, a binary digital signal whose level is switched between a high level and a low level is used as the data signal, and the potential of the high-level data signal is data 1 and the potential of the low-level data signal is data 0.

The potential of the data signal line SIG1 is determined by the data signal, whereby the value of the data Dsch is set. At this time, the potential of the data signal line SIG2 is set to a value of inverted data of the data Dsch by a data signal input through the data signal line SIG2.

Next, a data comparison operation will be described. Comparison between the data Dm and the data Dsch is conducted. At this time, the state of each of the transistor 212 and the transistor 213 is changed in accordance with the value of the data Dm and the value of the data Dsch. Accordingly, the value of the data Dm can be determined from the change. Note that before setting the value of the data Dsch, the potential of the gate of the transistor 214 (potential Vx) is set to a value that is equal to that of the low-level data signal.

For example, as illustrated in FIG. 2B, when the value of the data Dm is 0 and the value of the data Dsch is 0, the transistor 212 is in an off state and the transistor 213 is in an on state. At this time, the potential of the gate of the transistor 214 (potential Vx) has a value that is equal to the value of the high-level data signal, causing the transistor 214 to be in an on state.

When the data Dm is 1 and the data Dsch is 0, the transistor 212 is in an on state and the transistor 213 is in an off state. At this time, the potential of the gate of the transistor 214 (potential Vx) has a value that is equal to that of the low-level data signal, causing the transistor 214 to be in an off state.

When the data Dm is 0 and the data Dsch is 1, the transistor 212 and the transistor 213 are in an off state. At this time, the potential of the gate of the transistor 214 has a value that is equal to that of the low-level data signal, causing the transistor 214 to be in an off state.

When the data Dm is 1 and the data Dsch is 1, the transistor 212 is in an on state and the transistor 213 is in an off state. At this time, the potential of the gate of the transistor 214 (potential Vx) has a value that is equal to that of the high-level data signal, causing the transistor 214 to be in an on state.

As shown in FIG. 2B, when the value of the data Dm is equal to the value of the data Dsch in the memory cell 200, the transistor 214 is in an on state. Thus, whether the value of the data Dm matches the value of the data Dsch can be determined by checking whether the value of the potential of the gate of the transistor 214 has changed.

In the above-described manner, the operation in the example of the method for driving the memory device illustrated in FIG. 2A is conducted.

Figure 3:
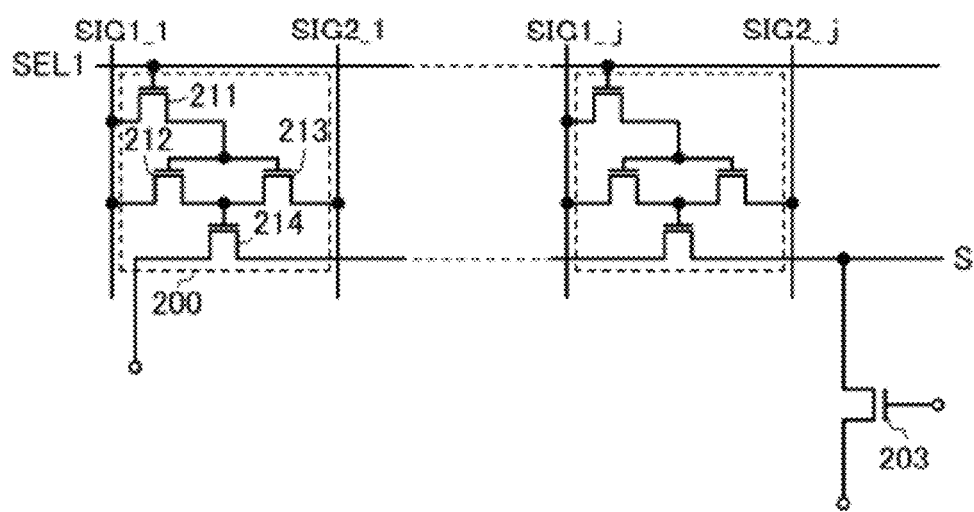
FIG. 3 illustrates an example of a memory device in Embodiment 2.

In the case where contents of plural bits of data are determined, sources and drains of the respective transistors 214 in a plurality of memory cells 200 are electrically connected in series as illustrated in FIG. 3 for example, whereby the plural bits of data can be determined. At this time, the potential of one of the source and the drain of the transistor 214 in the first-stage memory cell 200 is set to one of a high power supply potential and a low power supply potential. Further, a transistor 203 is provided. The transistor 203 is made to be in an on state, and the potential of a data signal S representing a comparison result is set to the other of the high power supply potential and the low power supply potential. Then, the transistor 203 is made to be in an off state. The value of the high power supply potential can be equal to the value of the high-level data signal, and the value of the low power supply potential can be equal to the value of the low-level data signal.

In the memory device illustrated in FIG. 3, the transistor 211 in each memory cell 200 is made to be in an on state by a selection signal input through the selection signal line SEL1, and data is written to each memory cell 200 by inputting plural bits of data signals through data signal lines SIG1_1 to SIG1_j (j is a natural number of 2 or more) and data signal lines SIG2_1 to SIG2_j. Comparison between the data Dm and the data Dsch is conducted in each memory cell 200, so that the value of the potential of the gate of the transistor 214 (potential Vx) is set. At this time, when the transistors 214 in all the memory cells 200 in the same row are in an on state, that is, when the value of the data Dm becomes equal to the value of the data Dsch in all the memory cells 200 in the same row, the value of the potential of the data signal S changes. Thus, contents of even plural bits of data can be determined.

As described with reference to FIGS. 2A and 2B and FIG. 3, in the example of the memory device in this embodiment, the first to fourth transistors (e.g., the transistors 211 to 214) can form a memory cell in which data stored therein is compared with search data to determine whether there is a match.

In the example of the memory device in this embodiment, instead of using a memory device such as an SRAM, data is stored in a memory cell with the use of the first transistor (e.g., transistor 211), which can reduce the number of elements in the memory cell as compared with that in the conventional memory device, resulting in a reduction in the circuit area.

In the example of the memory device in this embodiment, use of the transistor with low off-state current as the first transistor can increase the data holding period without the need for an additional capacitor. Accordingly, the number of elements in the memory cell can be reduced, whereby the circuit area can be reduced. Further, power consumption can be reduced.

(Embodiment 3)

In this embodiment, an example of a memory device which can determine whether the stored data matches search data and which can read data will be described.

Figures 4A, 4B:
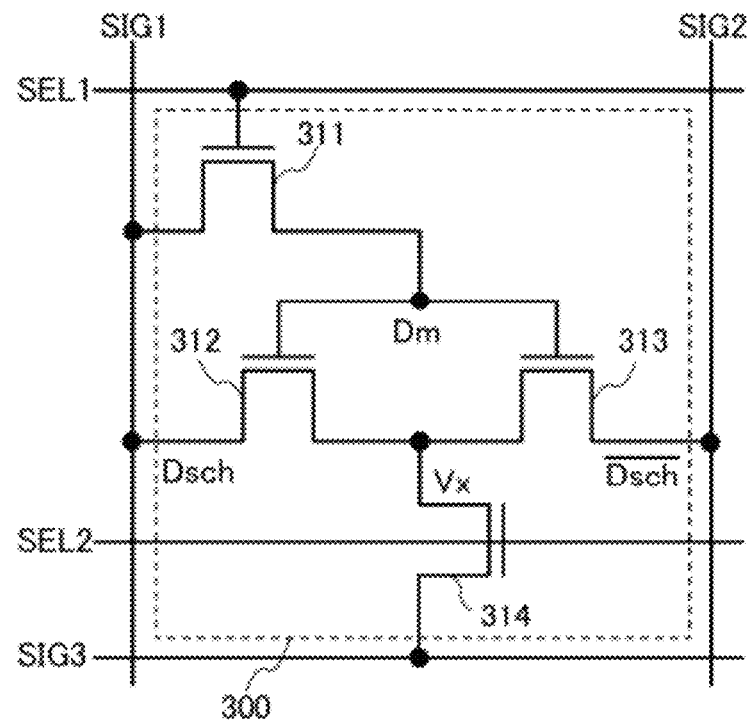
FIGS. 4A and 4B illustrate an example of a memory device in Embodiment 3.

A memory device illustrated in FIG. 4A includes a memory cell 300, a data signal line SIG1, a data signal line SIG2, a selection signal line SEL1, a selection signal line SEL2, and a data signal line SIG3.

The memory cell 300 has a function of comparing data Dm that is data stored in the memory cell 300 with data Dsch that is search data to determine the content of the data Dm.

In addition, the memory cell 300 includes a transistor 311, a transistor 312, a transistor 313, and a transistor 314.

The transistor 311 has a function of controlling writing and holding of data to the memory cell 300.

One of a source and a drain of the transistor 311 is electrically connected to the data signal line SIG1, and a gate of the transistor 311 is electrically connected to the selection signal line SEL1.

For example, the transistor with low off-state current, which can be applied to the transistor 111 in Embodiment 1, can be used as the transistor 311.

The transistor 312 is controlled to be in an on state or an off state in accordance with the value of the data Dm and the value of the data Dsch.

One of a source and a drain of the transistor 312 is electrically connected to the data signal line SIG1, and a gate of the transistor 312 is electrically connected to the other of the source and the drain of the transistor 311. The potential of the one of the source and the drain of the transistor 312 is that of the data Dsch, and the potential of the gate of the transistor 312 is that of the data Dm. Note that the one of the source and the drain of the transistor 312 is not necessarily electrically connected to the data signal line SIG1, and the transistor 312 may be electrically connected to another data signal line that is different from the data signal line SIG1.

As the transistor 312, a field effect transistor or the like can be used for example.

The transistor 313 is controlled to be in an on state or an off state in accordance with the value of the data Dm and the value of the data Dsch.

The transistor 313 has a conductivity type opposite to that of the transistor 312. One of a source and a drain of the transistor 313 is electrically connected to the data signal line SIG2, the other of the source and the drain of the transistor 313 is electrically connected to the other of the source and the drain of the transistor 312, and a gate of the transistor 313 is electrically connected to the other of the source and the drain of the transistor 311. The potential of the one of the source and the drain of the transistor 313 is that of inverted data of the data Dsch, and the potential of the gate of the transistor 313 is that of the data Dm. Note that the one of the source and the drain of the transistor 313 is not necessarily electrically connected to the data signal line SIG2 and may be, for example, electrically connected to a wiring to which a predetermined potential is given.

The transistor 314 has a function of determining whether data of a comparison result is read.

One of a source and a drain of the transistor 314 is electrically connected to the data signal line SIG3, and the other of the source and the drain of the transistor 314 is electrically connected to the other of the source and the drain of the transistor 312 and the other of the source and the drain of the transistor 313. A gate of the transistor 314 is electrically connected to the selection signal line SEL2.

For example, each of the transistors 312 to 314 can be the transistor that can be applied to the transistors 112 and 113 in Embodiment 1.

Next, as an example of a method for driving the memory device in this embodiment, an example of a method for driving the memory device illustrated in FIG. 4A will be described. As an example here, the transistor 311, the transistor 312, and the transistor 314 are n-channel transistors, and the transistor 313 is a p-channel transistor.

First, a data writing operation will be described. In the example of the method for driving the memory device illustrated in FIG. 4A, the transistor 311 in the memory cell 300 is made to be in an on state.

At this time, the potential of the gates of the transistor 312 and the transistor 313, that is, the value of the data Dm is determined by a data signal input through the data signal line SIG1. Thus, data is newly written to the memory cell 300. After that, the transistor 311 is made to be in an off state, thus holding the value of the data Dm. Note that here, for example, a binary digital signal whose level is switched between a high level and a low level is used as the data signal, and the potential of the high-level data signal is data 1 and the potential of the low-level data signal is data 0.

The potential of the data signal line SIG1 is determined by the data signal, whereby the value of the data Dsch is set. At this time, the potential of the data signal line SIG2 is set to a value of inverted data of the data Dsch by a data signal input through the data signal line SIG2.

Next, comparison between the data Dm and the data Dsch is conducted. At this time, the state of each of the transistor 312 and the transistor 313 is changed in accordance with the value of the data Dm and the value of the data Dsch. Accordingly, the value of the data Dm can be determined from the change. Note that before setting the value of the data Dsch, the potential of the other of the source and the drain of the transistor 314 (potential Vx) is reset to a value that is equal to that of the low-level data signal.

For example, as illustrated in FIG. 4B, when the value of the data Dm is 0 and the value of the data Dsch is 0, the transistor 312 is in an off state and the transistor 313 is in an on state. At this time, the potential of the other of the source and the drain of the transistor 314 (potential Vx) has a value that is equal to the value of the high-level data signal.

When the value of the data Dm is 1 and the value of the data Dsch is 0, the transistor 312 is in an on state and the transistor 313 is in an off state. At this time, the potential of the other of the source and the drain of the transistor 314 (potential Vx) has a value that is equal to that of the low-level data signal.

When the value of the data Dm is 0 and the value of the data Dsch is 1, the transistor 312 and the transistor 313 are in an off state. At this time, the potential of the other of the source and the drain of the transistor 314 (potential Vx) has a value that is equal to that of the low-level data signal.

When the value of the data Dm is 1 and the value of the data Dsch is 1, the transistor 312 is in an on state and the transistor 313 is in an off state. At this time, the potential of the other of the source and the drain of the transistor 314 (potential Vx) has a value that is equal to that of the high-level data signal.

As shown in FIG. 4B, when the value of the data Dm is equal to the value of the data Dsch in the memory cell 300, the potential of the other of the source and the drain of the transistor 314 (potential Vx) is set to a value that is equal to that of the high-level data signal. Thus, whether the value of the data Dm matches the value of the data Dsch can be determined by checking whether the value of the potential of the other of the source and the drain of the transistor 314 has changed.

Further, data representing a comparison result can be read from the memory cell 300.

Next, a data reading operation will be described. In the case of reading data representing a comparison result from the memory cell 300, the potential of the data signal line SIG3 is set to a high power supply potential. In addition, the transistor 314 is made to be in an on state by a selection signal input through the selection signal line SEL2.

At this time, the potential of the data signal line SIG3 has a value that is equal to that of the other of the source and the drain of the transistor 314; accordingly, data representing the result of comparison between the data Dm and the data Dsch in the memory cell 300 is read through the data signal line SIG3.

In the above-described manner, the operation in the example of the method for driving the memory device illustrated in FIG. 4A is conducted.

Figure 5:
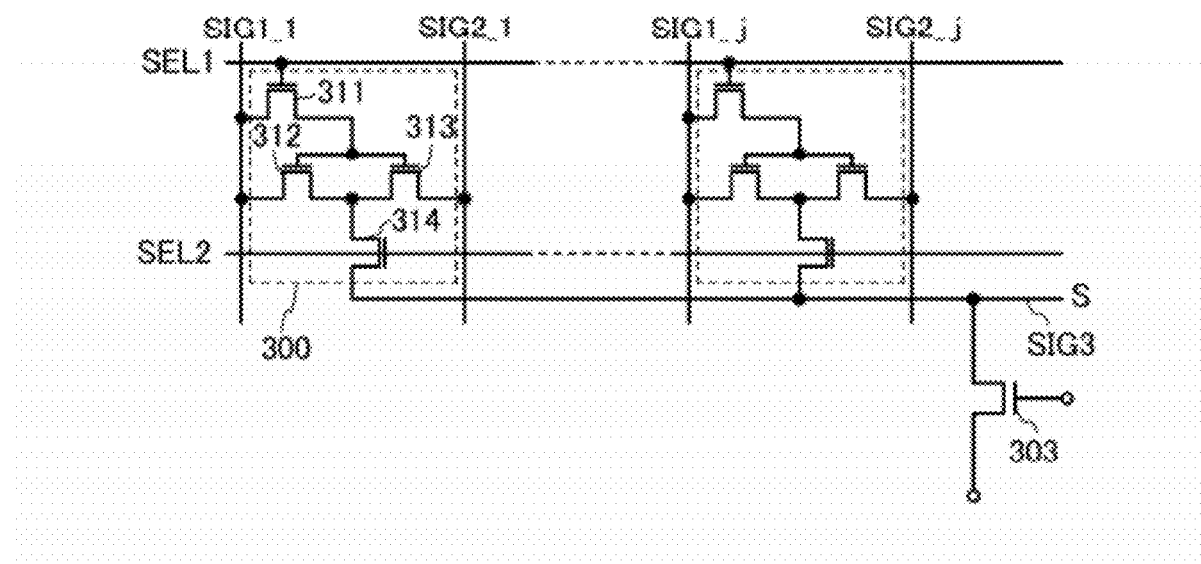
FIG. 5 illustrates an example of a memory device in Embodiment 3.

In the case where contents of plural bits of data are determined, sources and drains of the respective transistors 314 in a plurality of memory cells 300 are electrically connected in parallel as illustrated in FIG. 5 for example, whereby the plural bits of data can be determined. Further, a transistor 303 is provided. The transistor 303 is made to be in an on state, and the potential of a data signal S representing a comparison result is set to a high power supply potential or a low power supply potential. Then, the transistor 303 is made to be in an off state.

In the memory device illustrated in FIG. 5, the transistor 311 in each memory cell 300 is made to be in an on state by a selection signal input through the selection signal line SEL1, and data is written to each memory cell 300 by inputting plural bits of data signals through data signal lines SIG1_1 to SIG1_j (j is a natural number of 2 or more) and data signal lines SIG2_1 to SIG2_j. Further, comparison between the data Dm and the data Dsch is conducted in each memory cell 300, so that the value of the potential of the other of the source and the drain of the transistor 314 (potential Vx) is set. Then, the potential of the data signal line SIG3 is set to a high power supply potential or a low power supply potential, and the transistor 314 in each memory cell 300 is made to be in an on state by a selection signal input through the selection signal line SEL_2, whereby the value of the potential of the data signal S is set in accordance with the potential of the other of the source and the drain of the transistor 314 (potential Vx). At this time, when the value of the data Dm becomes equal to the value of the data Dsch in all the memory cells 300 in the same row, the value of the potential of the data signal S does not change. Thus, contents of even plural bits of data can be determined.

As described with reference to FIGS. 4A and 4B and FIG. 5, in the example of the memory device in this embodiment, the first to fourth transistors (e.g., the transistors 311 to 314) can form a memory cell in which data stored therein is compared with search data to determine whether there is a match.

In the example of the memory device in this embodiment, instead of using a memory device such as an SRAM for example, data is stored in a memory cell with the use of the first transistor (e.g., transistor 311), which can reduce the number of elements in the memory cell as compared with that in the conventional memory device, resulting in a reduction in the circuit area.

In the example of the memory device in this embodiment, use of the transistor with low off-state current as the first transistor can increase the data holding period without the need for an additional capacitor. Accordingly, the number of elements in the memory cell can be reduced, whereby the circuit area can be reduced. Further, power consumption can be reduced.

Further, in the example of the memory device in this embodiment, data stored in memory cells can be selectively read with the use of the fourth transistor (e.g., transistor 314). Thus, even in the case where a plurality of such memory cells is arranged in a matrix for example, data stored in memory cells in the designated row can be selectively read, allowing power consumption lower than that in the case of always collectively reading data in all memory cells.

(Embodiment 4)

In this embodiment, an example of a memory device which can determine whether the stored data matches search data and which can determine whether the value of the stored data is higher or lower than the value of the search data will be described.

Figures 6A, 6B:
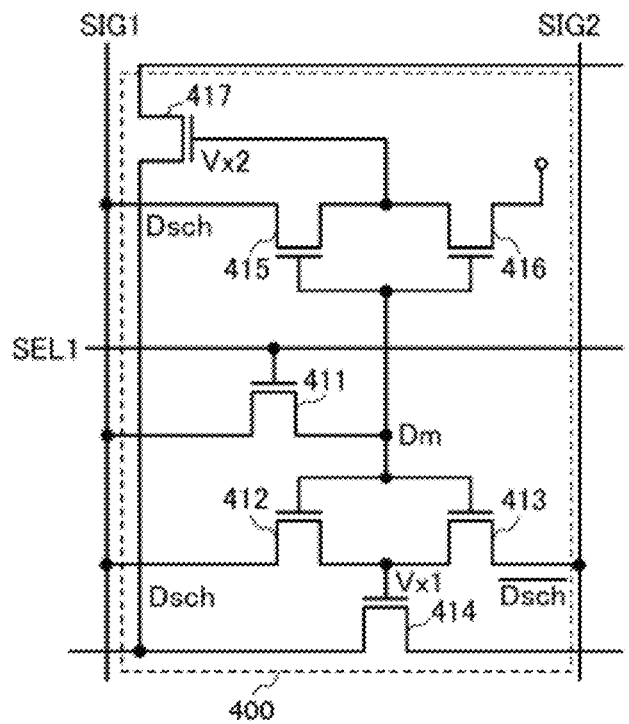
FIGS. 6A and 6B illustrate an example of a memory device in Embodiment 4.

A memory device illustrated in FIG. 6A includes a memory cell 400, a data signal line SIG1, a data signal line SIG2, and a selection signal line SEL1.

The memory cell 400 has a function of comparing data Dm that is data stored in the memory cell 400 with data Dsch that is search data to determine the content of the data Dm.

The memory cell 400 includes a transistor 411, a transistor 412, a transistor 413, a transistor 414, a transistor 415, a transistor 416, and a transistor 417.

The transistor 411 has a function of controlling writing and holding of data to the memory cell 400.

One of a source and a drain of the transistor 411 is electrically connected to the data signal line SIG1, and a gate of the transistor 411 is electrically connected to the selection signal line SEL1.

For example, the transistor with low off-state current, which can be applied to the transistor 111 in Embodiment 1, can be used as the transistor 411.

The transistor 412 is controlled to be in an on state or an off state in accordance with the value of the data Dm and the value of the data Dsch.

One of a source and a drain of the transistor 412 is electrically connected to the data signal line SIG1, and a gate of the transistor 412 is electrically connected to the other of the source and the drain of the transistor 411. The potential of the one of the source and the drain of the transistor 412 is that of the data Dsch, and the potential of the gate of the transistor 412 is that of the data Dm.

The transistor 413 is controlled to be in an on state or an off state in accordance with the value of the data Dm and the value of the data Dsch.

One of a source and a drain of the transistor 413 is electrically connected to the data signal line SIG2, the other of the source and the drain of the transistor 413 is electrically connected to the other of the source and the drain of the transistor 412, and a gate of the transistor 413 is electrically connected to the other of the source and the drain of the transistor 411. The potential of the one of the source and the drain of the transistor 413 is that of inverted data of the data Dsch, and the potential of the gate of the transistor 413 is that of the data Dm. Note that the one of the source and the drain of the transistor 413 is not necessarily electrically connected to the data signal line SIG2 and may be, for example, electrically connected to a wiring to which a predetermined potential is given.

The transistor 414 is controlled to be in an on state or an off state in accordance with the result of the comparison between the data Dm and the data Dsch.

A gate of the transistor 414 is electrically connected to the other of the source and the drain of the transistor 412 and the other of the source and the drain of the transistor 413.

As the transistor 414, a field effect transistor or the like can be used for example.

The transistor 415 is controlled to be in an on state or an off state in accordance with the result of the comparison between the data Dm and the data Dsch.

One of a source and a drain of the transistor 415 is electrically connected to the data signal line SIG1, and a gate of the transistor 415 is electrically connected to the other of the source and the drain of the transistor 411. The potential of the one of the source and the drain of the transistor 415 is that of the data Dsch, and the potential of the gate of the transistor 415 is that of the data Dm.

The transistor 416 is controlled to be in an on state or an off state in accordance with the result of the comparison between the data Dm and the data Dsch.

One of a source and a drain of the transistor 416 is electrically connected to the other of the source and the drain of the transistor 415. A predetermined value of potential is given to the other of the source and the drain of the transistor 416, and a gate of the transistor 416 is electrically connected to the other of the source and the drain of the transistor 411. The potential of the gate of the transistor 416 is that of the data Dm.

The transistor 417 is controlled to be in an on state or an off state in accordance with the result of the comparison between the data Dm and the data Dsch.

A gate of the transistor 417 is electrically connected to the other of the source and the drain of the transistor 415 and the one of the source and the drain of the transistor 416.

For example, each of the transistors 412 to 417 can be the transistor that can be applied to the transistors 112 and 113 in Embodiment 1.

Next, as an example of a method for driving the memory device in this embodiment, an example of a method for driving the memory device illustrated in FIG. 6A will be described. As an example here, the transistor 411, the transistor 412, the transistor 414, the transistor 416, and the transistor 417 are n-channel transistors, and the transistor 413 and the transistor 415 are p-channel transistors. The potential of the other of the source and the drain of the transistor 416 is a low power supply potential.

First, a data writing operation will be described. In the example of the method for driving the memory device illustrated in FIG. 6A, the transistor 411 in the memory cell 400 is made to be in an on state by a selection signal input through the selection signal line SEL1.

At this time, the potential of the gates of the transistors 412, 413, 415, and 416, that is, the value of the data Dm is determined by a data signal input through the data signal line SIG1. Thus, data is newly written to the memory cell 400. After that, the transistor 411 is made to be in an off state; thus the value of the data Dm is held. Here, for example, a binary digital signal whose level is switched between a high level and a low level is used as the data signal, and the potential of the high-level data signal is data 1 and the potential of the low-level data signal is data 0.

The potential of the data signal line SIG1 is determined by the data signal, whereby the value of the data Dsch is set. At this time, the potential of the data signal line SIG2 is set to a value of inverted data of the data Dsch by a data signal input through the data signal line SIG2.

Next, comparison between the data Dm and the data Dsch is conducted. At this time, the state of each of the transistors 412, 413, 415, and 416 is changed in accordance with the value of the data Dm and the value of the data Dsch. Accordingly, the value of the data Dm can be determined from the change. Note that before setting the value of the data Dsch, the potential of the gate of the transistor 414 (potential Vx1) and the potential of the gate of the transistor 417 (potential Vx2) are set to a value that is equal to that of the low-level data signal.

For example, as illustrated in FIG. 6B, when the value of the data Dm is 0 and the value of the data Dsch is 0, the transistor 413 is in an on state and the transistors 412, 415, and 416 are in an off state. At this time, the potential of the gate of the transistor 414 (potential Vx1) has a value that is equal to the value of the high-level data signal, causing the transistor 414 to be in an on state. In addition, the potential of the gate of the transistor 417 (potential Vx2) has a value that is equal to that of the low-level data signal, causing the transistor 417 to be in an off state.

When the value of the data Dm is 1 and the value of the data Dsch is 0, the transistors 412 and 416 are in an on state and the transistors 413 and 415 are in an off state. At this time, the potential of the gate of the transistor 414 (potential Vx1) has a value that is equal to that of the low-level data signal, causing the transistor 414 to be in an off state. In addition, the potential of the gate of the transistor 417 (potential Vx2) has a value that is equal to that of the low-level data signal, causing the transistor 417 to be in an off state.

When the value of the data Dm is 0 and the value of the data Dsch is 1, the transistor 415 is in an on state, and the transistors 412, 413, and 416 are in an off state. At this time, the potential of the gate of the transistor 414 (potential Vx1) has a value that is equal to that of the low-level data signal, causing the transistor 414 to be in an off state. In addition, the potential of the gate of the transistor 417 (potential Vx2) has a value that is equal to that of the high-level data signal, causing the transistor 417 to be in an on state.

When the value of the data Dm is 1 and the value of the data Dsch is 1, the transistors 412 and 416 are in an on state and the transistors 413 and 415 are in an off state. At this time, the potential of the gate of the transistor 414 (potential Vx1) has a value that is equal to that of the high-level data signal, causing the transistor 414 to be in an on state. In addition, the potential of the gate of the transistor 417 (potential Vx2) is set to a value that is equal to that of the low-level data signal, causing the transistor 417 to be in an off state.

As shown in FIG. 6B, when the value of the data Dm is equal to the value of the data Dsch in the memory cell 400, the transistor 414 is in an on state. Thus, whether the value of the data Dm matches the value of the data Dsch can be determined by checking whether the value of the potential of the source or the drain of the transistor 414 has changed. In the case where the value of the data Dm does not match the value of the data Dsch and the value of the data Dm is lower than that of the data Dsch, the transistor 417 is in an on state, while in the case where the value of the data Dm is higher than that of the data Dsch, the transistor 417 is in an off state. Thus, whether the value of the data Dm is higher or lower than the value of the data Dsch can also be determined by checking whether the value of the potential of the source or the drain of the transistor 417 has changed.

In the above-described manner, the operation in the example of the method for driving the memory device illustrated in FIG. 6A is conducted.

Figure 7:
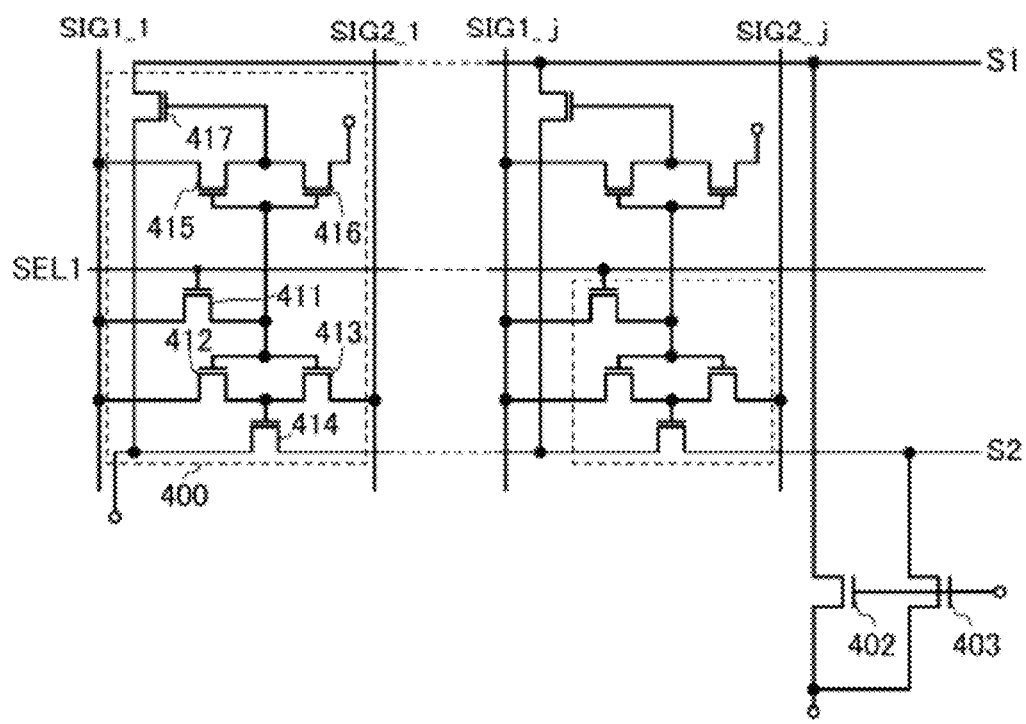
FIG. 7 illustrates an example of a memory device in Embodiment 4.

In the case where contents of plural bits of data are determined, sources and drains of the respective transistors 414 in a plurality of memory cells 400 in the same row are electrically connected in series and sources and drains of the respective transistors 417 in the plurality of memory cells 400 in the same row are electrically connected in parallel as illustrated in FIG. 7 for example, whereby the plural bits of data can be determined. At this time, the potential of one of the source and the drain of the transistor 414 in the first-stage memory cell 400 and the potential of the other of the source and the drain of the transistor 417 in the first-stage memory cell 400 are set to one of a high power supply potential and a low power supply potential. Further, a transistor 402 is provided. The transistor 402 is made to be in an on state to set the potential of a data signal S1 representing a comparison result to the other of the high power supply potential and the low power supply potential. Then, the transistor 402 is made to be in an off state. A transistor 403 is provided. The transistor 403 is made to be in an on state to set the potential of a data signal S2 representing a comparison result to the other of the high power supply potential and the low power supply potential. Then, the transistor 403 is made to be in an off state.

In the memory device illustrated in FIG. 7, the transistor 411 in each memory cell 400 is made to be in an on state by a selection signal input through the selection signal line SEL1, and data is written to each memory cell 400 by inputting plural bits of data signals through data signal lines SIG1_1 to SIG1_j (j is a natural number of 2 or more) and data signal lines SIG2_1 to SIG2_j. Further, comparison between the data Dm and the data Dsch is conducted in each memory cell 400, so that the value of the potential of the gate of the transistor 414 (potential Vx1) and the value of the potential of the gate of the transistor 417 (potential Vx2) are set. Thus, contents of even plural bits of data can be determined.

As described with reference to FIGS. 6A and 6B and FIG. 7, in the example of the memory device in this embodiment, the first to seventh transistors (e.g., the transistors 411 to 417) can form a memory cell in which data stored therein is compared with search data to determine whether there is a match and which can determine whether the value of the stored data is higher or lower than the value of the search data. Accordingly, contents of data can be determined in more detail and thus search accuracy can be improved.

In the example of the memory device in this embodiment, instead of using a memory device such as an SRAM, a DRAM, and a flash memory for example, data is stored in a memory cell with the use of the first transistor (e.g., transistor 411), which can reduce the number of elements in the memory cell as compared with that in the conventional memory device, resulting in a reduction in the circuit area.

In the example of the memory device in this embodiment, use of the transistor with low off-state current as the first transistor can increase the data holding period without the need for an additional capacitor. Accordingly, the number of elements in the memory cell can be reduced, whereby the circuit area can be reduced. Further, power consumption can be reduced.

(Embodiment 5)

This embodiment will show examples of a field-effect transistor that includes an oxide semiconductor layer and can be applied to the transistor in the memory device in the above embodiments.

Examples of structures of transistors in this embodiment will be described with reference to FIGS. 8A and 8B.

Figure 8A:
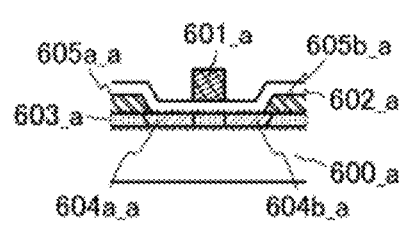
FIGS. 8A and 8B are cross-sectional schematic views each illustrating an example of a structure of a transistor in Embodiment 5.

The transistor illustrated in FIG. 8A includes a conductive layer 601_a, an insulating layer 602_a, a semiconductor layer 603_a, a conductive layer 605a_a, and a conductive layer 605b_a.

The semiconductor layer 603_a includes a region 604a_a and a region 604b_a. The region 604a_a and the region 604b_a are positioned apart from each other and doped with a dopant. Note that a region between the region 604a_a and the region 604b_a serves as a channel formation region. The semiconductor layer 603_a is provided over an element formation layer 600a. Note that it is not necessary to provide the region 604a_a and the region 604b_a.

The conductive layer 605a_a and the conductive layer 605b_a are provided over the semiconductor layer 603_a and electrically connected to the semiconductor layer 603_a. Side surfaces of the conductive layers 605a_a and 605b_a are tapered; however, this embodiment is not limited thereto.

The conductive layer 605a_a overlaps with part of the region 604a_a; however, this embodiment is not limited to this structure. When the conductive layer 605a_a overlaps with part of the region 604a_a, the resistance between the conductive layer 605a_a and the region 604a_a can be low. Further, a region of the semiconductor layer 603_a where the conductive layer 605a_a overlaps with the semiconductor layer 603_a may be the region 604a_a.

The conductive layer 605b_a overlaps with part of the region 604b_a; however, this embodiment is not limited to this structure. When the conductive layer 605b_a overlaps with part of the region 604b_a, the resistance between the conductive layer 605b_a and the region 604b_a can be low. Further, a region of the semiconductor layer 603_a where the conductive layer 605b_a overlaps with the semiconductor layer 603_a may be the region 604b_a.

The insulating layer 602_a is provided over the semiconductor layer 603_a, the conductive layer 605a_a, and the conductive layer 605b_a.

The conductive layer 601_a is provided over part of the insulating layer 602_a, and overlaps with the semiconductor layer 603_a with the insulating layer 602_a placed therebetween. A region of the semiconductor layer 603_a, which overlaps with the conductive layer 601_a with the insulating layer 602_a placed therebetween, serves as the channel formation region.

Figure 8B:
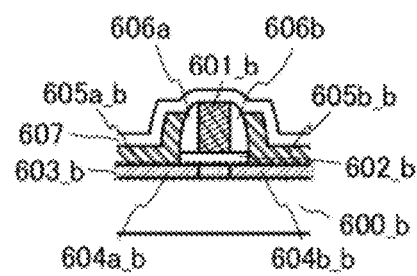

The transistor illustrated in FIG. 8B includes a conductive layer 601_b, an insulating layer 602_b, a semiconductor layer 603_b, a conductive layer 605a_b, a conductive layer 605b_b, an insulating layer 606a, an insulating layer 606b, and an insulating layer 607.

The semiconductor layer 603_b includes a region 604a_b and a region 604b_b. The region 604a b and the region 604b_b are positioned apart from each other and doped with a dopant. The semiconductor layer 603_b is electrically connected to the conductive layers 605a_b and 605b_b. Note that it is not necessary to provide the region 604ab and the region 604bb. An embedded insulating region may be provided in the element formation layer 600_b and the region 604a_b and the region 604b_b may be provided in contact with the embedded insulating region. In the case of providing the embedded insulating region, oxygen can be easily supplied to the semiconductor layer 603_b.

The insulating layer 602_b is provided over part of the semiconductor layer 603_b.

The conductive layer 601_b is provided over part of the insulating layer 602_b, and overlaps with the semiconductor layer 603_b with the insulating layer 602_b placed therebetween. A region of the semiconductor layer 603_b, which overlaps with the conductive layer 601_b with the insulating layer 602_b placed therebetween, serves as a channel formation region of the transistor. Note that an insulating layer may be provided over the conductive layer 601_b.

The insulating layer 606a is provided over the insulating layer 602_b and is in contact with one of a pair of side surfaces of the conductive layer 601_b.

The insulating layer 606b is provided over the insulating layer 602_b and is in contact with the other of the pair of side surfaces of the conductive layer 601_b.

Note that the dopant concentration in the portions of the regions 604a b and 604b_b, which overlap with the insulating layers 606a and 606b with the insulating layer 602_b placed therebetween, may be lower than that of the portions of the regions 604a_b and 604b_b, which overlap with neither the insulating layer 606a nor the insulating layer 606b.

The conductive layers 605a_b and 605b_b are provided over the semiconductor layer 603_b.

The conductive layer 605a_b is electrically connected to the region 604a_b and is in contact with the insulating layer 606a.

The conductive layer 605b_b is electrically connected to the region 604b_b and is in contact with the insulating layer 606b.

The insulating layer 607 is provided over the conductive layer 601_b, the conductive layers 605a_b and 605b_b, and the insulating layers 606a and 606b.

Next, the components illustrated in FIGS. 8A and 8B will be described.

As the element formation layers 600_a and 600_b, insulating layers or substrates having insulating surfaces can be used, for example. Further, layers over which elements are formed in advance can be used as the element formation layers 600_a and 600_b.

Each of the conductive layers 601_a and 601_b has a function of a gate of the transistor. Note that a layer functioning as a gate of the transistor can be called gate electrode or gate wiring.

As the conductive layers 601_a and 601_b, it is possible to use, for example, a layer of a metal material such as molybdenum, magnesium, titanium, chromium, tantalum, tungsten, aluminum, copper, neodymium, or scandium or an alloy material containing any of these materials as a main component. Moreover, the conductive layers 601_a and 601_b can be a stack of layers containing materials applicable to the conductive layers 601_a and 601_b.

Each of the insulating layers 602_a and 602_b has a function of a gate insulating layer of the transistor.

Each of the insulating layers 602_a and 602_b can be, for example, a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, a hafnium oxide layer, or a lanthanum oxide layer. Moreover, the insulating layers 602_a and 602_b can be a stack of layers containing materials applicable to the insulating layers 602_a and 602_b.

Alternatively, as the insulating layers 602_a and 602_b, an insulating layer of a material containing, for example, an element that belongs to Group 13 in the periodic table and oxygen can be used. For example, when the semiconductor layers 603_a and 603_b contain a Group 13 element, the use of insulating layers containing a Group 13 element as insulating layers in contact with the semiconductor layers 603_a and 603_b makes the state of interfaces between the insulating layers and the oxide semiconductor layers favorable.

Examples of the material containing a Group 13 element and oxygen include gallium oxide, aluminum oxide, aluminum gallium oxide, and gallium aluminum oxide. Note that aluminum gallium oxide refers to a substance in which the amount of aluminum is larger than that of gallium in atomic percent, and gallium aluminum oxide refers to a substance in which the amount of gallium is larger than or equal to that of aluminum in atomic percent. For example, it is possible to use a material represented by $Al_2O_x$ (x=3+α, where a is larger than 0 and smaller than 1), $Ga_2O_x$ (x=3+α, where α is larger than 0 and smaller than 1), or $Ga_xAl_{2-x}O_3$+α (x is larger than 0 and smaller than 2 and α is larger than 0 and smaller than 1).

The insulating layers 602_a and 602_b can be a stack of layers of materials applicable to the insulating layers 602_a and 602_b. For example, the insulating layers 602_a and 602_b can be a stack of layers containing gallium oxide represented by $Ga_2O_x$. Alternatively, the insulating layers 602_a and 602_b may be a stack of an insulating layer containing gallium oxide represented by $Ga_2O_x$ and an insulating layer containing aluminum oxide represented by $Al_2O_x$.

Each of the semiconductor layers 603_a and 603_b functions as a layer in which a channel of the transistor is formed. Examples of an oxide semiconductor applicable to the semiconductor layers 603_a and 603_b are In-based oxide (e.g., indium oxide), Sn-based oxide (e.g., tin oxide), and Zn-based oxide (e.g., zinc oxide).

As the metal oxide, a four-component metal oxide, a three-component metal oxide, or a two-component metal oxide can also be used, for example. Note that a metal oxide which can be used as the above oxide semiconductor may include gallium as a stabilizer for reducing variation in characteristics. A metal oxide which can be used as the above oxide semiconductor may include tin as the stabilizer. A metal oxide which can be used as the above oxide semiconductor may include hafnium as the stabilizer. A metal oxide which can be used as the above oxide semiconductor may include aluminum as the stabilizer. A metal oxide which can be used as the above oxide semiconductor may include one or more of the following materials as the stabilizer: lanthanum, cerium, praseodymium, neodymium, samarium, europium, gadolinium, terbium, dysprosium, holmium, erbium, thulium, ytterbium, and lutetium, which are lanthanoid. Further, the metal oxide that can be used as the oxide semiconductor may contain silicon oxide.

Examples of the four-component metal oxide include an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

Examples of the three-component metal oxide include an In—Ga—Zn-based oxide, an In—Sn—Zn-based oxide, an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, and an In—Lu—Zn-based oxide.

Examples of the two-component metal oxide include an In—Zn-based oxide, a Sn—Zn-based oxide, an Al—Zn-based oxide, a Zn—Mg-based oxide, a Sn—Mg-based oxide, an In—Mg-based oxide, an In—Sn-based oxide, and an In—Ga-based oxide.

Note that for example, an In—Ga—Zn-based oxide refers to an oxide containing In, Ga, and Zn, and there is no limitation on the composition ratio of In, Ga, and Zn. The In—Ga—Zn-based oxide may contain a metal element other than In, Ga, and Zn.

As the oxide semiconductor, a material represented by $InLO_3(ZnO)_m$ (m is larger than 0) can be used. Here, L in $InLO_3(ZnO)_m$ represents one or more metal elements selected from Ga, Al, Mn, and Co.

For example, as the oxide semiconductor, an In—Ga—Zn-based oxide with an atomic ratio of In:Ga:Zn=1:1:1 (=1/3:1/3:1/3) or In:Ga:Zn=2:2:1 (=2/5:2/5:1/5), or any of oxides whose composition is in the neighborhood of the above compositions can be used. Moreover, as the oxide semiconductor, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8) or any of oxides whose composition is in the neighborhood of the above compositions can be used.

However, the oxide semiconductor is not limited to the materials given above, and a material with an appropriate composition can be used depending on required semiconductor characteristics (e.g., mobility, threshold voltage, and variation). In order to obtain the required semiconductor characteristics, it is preferable that the carrier concentration, the impurity concentration, the defect density, the atomic ratio between a metal element and oxygen, the interatomic distance, the density, and the like be set to appropriate values.

The oxide semiconductor may be either single crystal or non-single-crystal. In the latter case, the oxide semiconductor may be either amorphous or polycrystal. Further, the oxide semiconductor may have either an amorphous structure including a portion having crystallinity or a non-amorphous structure.

As the semiconductor layers 603_a and 603_b, it is possible to use a layer of a crystal with c-axis alignment (c-axis aligned crystal (CAAC)), which has a triangular or hexagonal atomic arrangement when seen from the direction of an a-b plane, a surface, or an interface. In the crystal, metal atoms are arranged in a layered manner or metal atoms and oxygen atoms are arranged in a layered manner along the c-axis, and the direction of the a-axis or the b-axis is varied in the a-b plane (the crystal rotates around the c-axis).

The CAAC is not single crystal, but this does not mean that the CAAC is composed of only an amorphous component. Although the CAAC includes a crystallized portion (crystalline portion), a boundary between one crystalline portion and another crystalline portion is not clear in some cases.

In the case where oxygen is included in the CAAC, nitrogen may be substituted for part of oxygen included in the CAAC. The c-axes of individual crystalline portions included in the CAAC may be aligned in one direction (e.g., a direction perpendicular to a surface of a substrate over which the CAAC is formed or a surface of the CAAC). Alternatively, the normals of the a-b planes of the individual crystalline portions included in the CAAC may be aligned in one direction (e.g., a direction perpendicular to a surface of a substrate over which the CAAC is formed or a surface of the CAAC).

The CAAC becomes a conductor, a semiconductor, or an insulator depending on its composition or the like. The CAAC transmits or does not transmit visible light depending on its composition or the like.

An example of such a CAAC is a crystal which is formed into a film shape and has a triangular or hexagonal atomic arrangement when observed from the direction perpendicular to a surface of the film or a surface of a substrate over which the CAAC is formed, and in which metal atoms are arranged in a layered manner or metal atoms and oxygen atoms (or nitrogen atoms) are arranged in a layered manner when a cross section of the film is observed.

As the oxide semiconductor, a semiconductor layer including a crystalline region with c-axis alignment may be used. Note that the composition of the crystalline region with c-axis alignment is represented by $In_{1+\delta}Ga_{1-\delta}O_3(ZnO)_m$ (0<δ<1, 1≤M≤3), and the composition of the entire semiconductor layer including the crystalline region with c-axis alignment is represented by $In_PGa_QO_R(ZnO)_M$ (0<P<2, 0<Q<2, 1≤M≤3).

For example, in the case where the semiconductor layers 603_a and 603_b are CAAC oxide semiconductor layers and the channel length of the transistor is 30 nm, a short-channel effect of the transistors can be prevented even when the semiconductor layers 603_a and 603_b have a thickness of about 5 nm, for instance.

Examples of a crystal structure of the CAAC will be described with reference to FIGS. 9A to 9E, FIGS. 10A to 10C, FIGS. 11A to 11C, and FIGS. 12A and 12B. In FIGS. 9A to 9E, FIGS. 10A to 10C, FIGS. 11A to 11C, and FIGS. 12A and 12B, the vertical direction corresponds to the c-axis direction and a plane perpendicular to the c-axis direction corresponds to the a-b plane, unless otherwise specified. Note that an "upper half" and a "lower half" refer to an upper half above the a-b plane and a lower half below the a-b plane (an upper half and a lower half with respect to the a-b plane). Furthermore, in FIGS. 9A to 9E, O surrounded by a circle represents a tetracoordinate oxygen atom (also referred to as tetracoordinate O) and O surrounded by a double circle represents tricoordinate O.

Figure 9A:
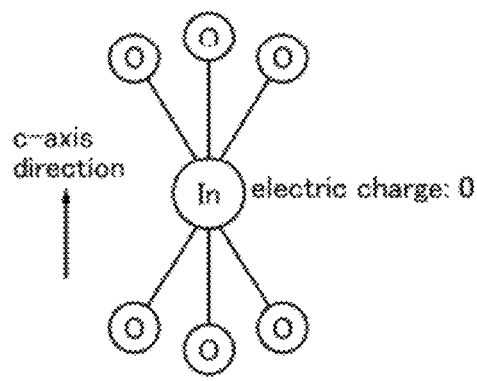
FIGS. 9A to 9E show crystal structures of oxide materials.

FIG. 9A illustrates a structure including one hexacoordinate indium (hexacoordinate In) atom and six tetracoordinate oxygen (tetracoordinate O) atoms proximate to the hexacoordinate In atom. Note that a structure including one metal atom such as an In atom and oxygen atoms proximate to the metal atom is referred to as small group. In FIG. 9A, an octahedral structure is illustrated as a planar structure for convenience. Three tetracoordinate O atoms exist in each of the upper and lower halves in FIG. 9A. The electric charge of the small group in FIG. 9A is 0.

Figure 9D:
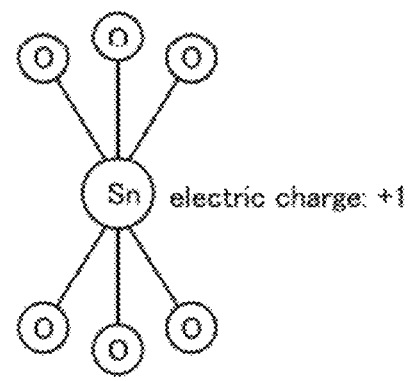
Figure 9B:
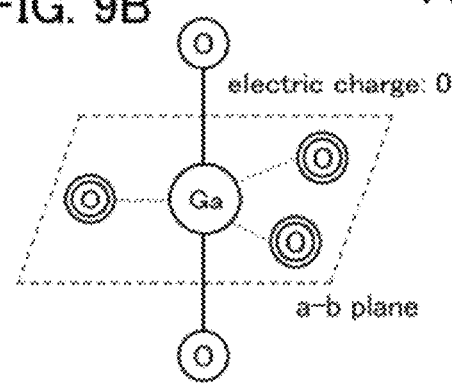

FIG. 9B illustrates a structure including one pentacoordinate Ga atom, three tricoordinate oxygen (tricoordinate O) atoms proximate to the pentacoordinate Ga atom, and two tetracoordinate O atoms proximate to the pentacoordinate Ga atom. All the three tricoordinate O atoms exist on the a-b plane. In FIG. 9B, one tetracoordinate O atom exists in each of the upper and lower halves. Since there is a pentacoordinate indium (pentacoordinate In) atom as well as a hexacoordinate In atom, the structure in FIG. 9B can be composed of a pentacoordinate In atom, three tricoordinate O atoms, and two tetracoordinate O atoms. The electric charge of the small group in FIG. 9B is 0.

Figure 9E:
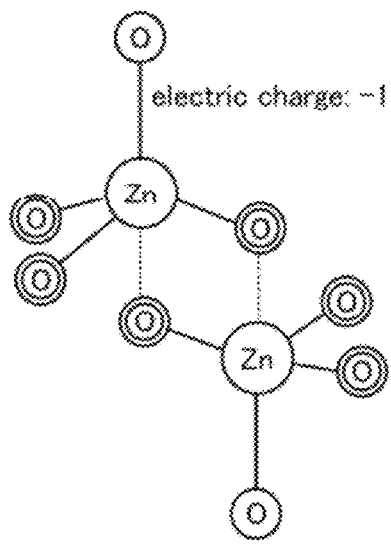
Figure 9C:
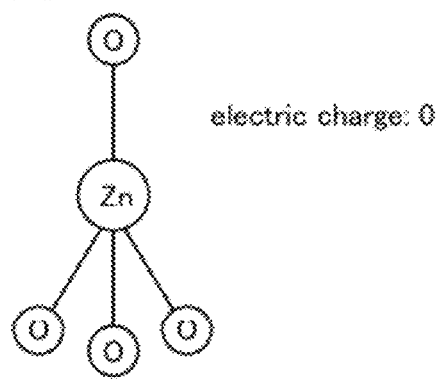

FIG. 9C illustrates a structure including one tetracoordinate zinc (tetracoordinate Zn) atom and four tetracoordinate O atoms proximate to the tetracoordinate Zn atom. In FIG. 9C, one tetracoordinate O atom exists in the upper half and three tetracoordinate O atoms exist in the lower half Alternatively, in FIG. 9C, three tetracoordinate O atoms may exist in the upper half and one tetracoordinate O atom may exist in the lower half The electric charge of the small group in FIG. 9C is 0.

FIG. 9D illustrates a structure including one hexacoordinate tin (hexacoordinate Sn) atom and six tetracoordinate O atoms proximate to the hexacoordinate Sn atom. In FIG. 9D, three tetracoordinate O atoms exist in each of the upper and lower halves. The electric charge of the small group in FIG. 9D is +1.

FIG. 9E illustrates a small group including two zinc atoms. In FIG. 9E, one tetracoordinate O atom exists in each of the upper and lower halves. The electric charge of the small group in FIG. 9E is −1.

Note that a plurality of small groups form a medium group, and a plurality of medium groups form a large group (also referred to as unit cell).

A rule of bonding between the small groups is described below. For example, three tetracoordinate O atoms in the upper half with respect to a hexacoordinate In atom in FIG. 9A are each bonded to three proximate hexacoordinate In atoms therebelow, and three tetracoordinate O atoms in the lower half are each bonded to three proximate hexacoordinate In atoms thereabove. One tricoordinate O atom in the upper half with respect to a pentacoordinate Ga atom in FIG. 9B is bonded to one proximate pentacoordinate Ga atom therebelow, and one tricoordinate O atom in the lower half is bonded to one proximate pentacoordinate Ga atom thereabove. Moreover, one tetracoordinate O atom in the upper half with respect to a tetracoordinate Zn atom in FIG. 9C is bonded to one proximate tetracoordinate Zn atom therebelow, and three tetracoordinate O atoms in the lower half are each bonded to three proximate tetracoordinate Zn atoms thereabove. In this manner, the number of tetracoordinate O atoms above a metal atom is equal to the number of proximate metal atoms below each tetracoordinate O atom. Similarly, the number of tetracoordinate O atoms below a metal atom is equal to the number of proximate metal atoms above each tetracoordinate O atom. Here, since the coordination number of the tetracoordinate O atom is 4, the total number of proximate metal atoms below and above the O atom is 4. Accordingly, when the sum of the number of tetracoordinate O atoms above a metal atom and the number of tetracoordinate O atoms below another metal atom is 4, two kinds of small groups including the metal atoms can be bonded to each other. For example, in the case where a hexacoordinate metal (In or Sn) atom is bonded through three tetracoordinate O atoms in the lower half, it is bonded to a pentacoordinate metal atom or a tetracoordinate metal atom.

A metal atom whose coordination number is 4, 5, or 6 is bonded to another metal atom through a tetracoordinate O atom in the c-axis direction. In addition, a medium group can be formed by combining a plurality of small groups so that the total electric charge of the layered structure is 0.

Figure 10A:
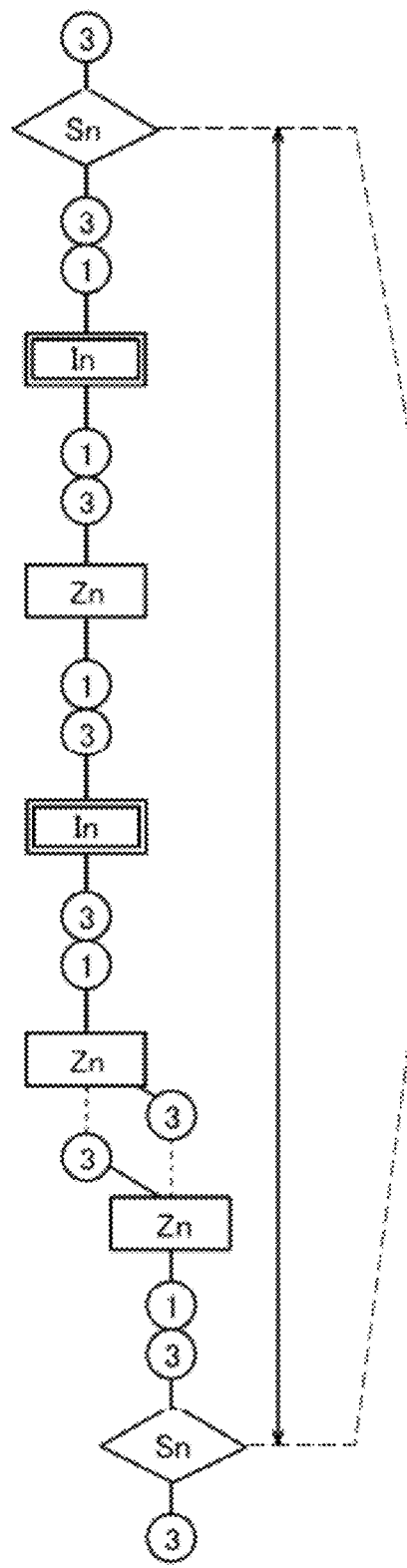
FIGS. 10A to 10C show a crystal structure of an oxide material.
Figure 10B:
Figure 10C:
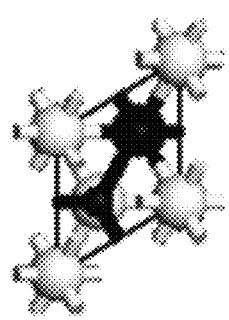

FIG. 10A illustrates a model of a medium group included in a layered structure of an In—Sn—Zn-based material. FIG. 10B illustrates a large group including three medium groups. FIG. 10C illustrates an atomic arrangement where the layered structure shown in FIG. 10B is observed from the c-axis direction.

Note that in FIG. 10A, for convenience, a tricoordinate O atom is omitted and only the number of tetracoordinate O atoms is shown in a circle; for example, three tetracoordinate O atoms existing in each of the upper and lower halves with respect to a Sn atom are denoted by circled 3. Similarly, in FIG. 10A, one tetracoordinate O atom existing in each of the upper and lower halves with respect to an In atom is denoted by circled 1. FIG. 10A also shows a Zn atom proximate to one tetracoordinate O atom in the lower half and three tetracoordinate O atoms in the upper half, and a Zn atom proximate to one tetracoordinate O atom in the upper half and three tetracoordinate O atoms in the lower half The medium group included in the layered structure of the In—Sn—Zn-based material in FIG. 10A has the following structure. In the order starting from the top, a Sn atom proximate to three tetracoordinate O atoms in each of the upper and lower halves is bonded to an In atom proximate to one tetracoordinate O atom in each of the upper and lower halves; the In atom is bonded to a Zn atom proximate to three tetracoordinate O atoms in the upper half, and is bonded to an In atom proximate to three tetracoordinate O atoms in each of the upper and lower halves through one tetracoordinate O atom in the lower half and the Zn atom; and the In atom is bonded to a small group that includes two Zn atoms and is proximate to one tetracoordinate O atom in the upper half, and is bonded to a Sn atom proximate to three tetracoordinate O atoms in each of the upper and lower halves through one tetracoordinate O atom in the lower half of the small group. A plurality of the medium groups are bonded to form a large group.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, by which the electric charge of +1 is canceled, is needed to form a layered structure including a Sn atom. As a structure having electric charge of −1, the small group including two Zn atoms as illustrated in FIG. 9E can be given. For example, with one small group including two Zn atoms, electric charge of one small group including a Sn atom can be cancelled, so that the total electric charge of the layered structure can be 0.

Further, an In—Sn—Zn-based crystal ($In_2SnZn_3O_8$) can be obtained with a structure in which the large group in FIG. 10B is repeated. The layered structure of the In—Sn—Zn-based crystal can be expressed by a composition formula, $In_2SnZn_2O_7(ZnO)_m$ (m is 0 or a natural number).

The same can be said for the case of using the other four-component metal oxides, three-component metal oxides, and two-component metal oxides shown in this embodiment and other metal oxides.

Figure 11A:
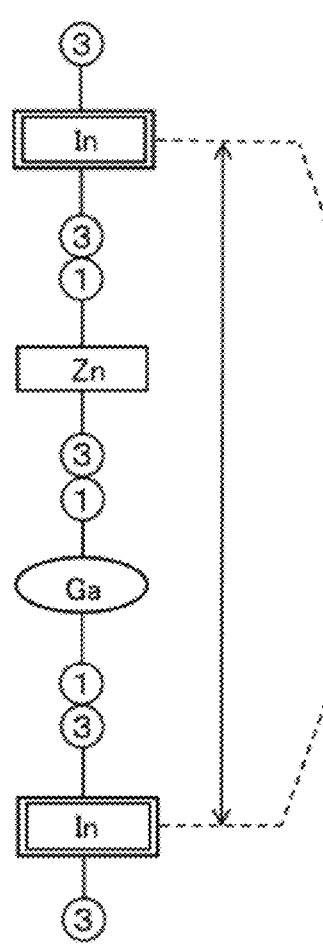
FIGS. 11A to 11C show a crystal structure of an oxide material.

As an example, FIG. 11A illustrates a model of a medium group included in a layered structure of an In—Ga—Zn-based material.

The medium group included in the layered structure of the In—Ga—Zn-based material in FIG. 11A has the following structure. In the order starting from the top, an In atom proximate to three tetracoordinate O atoms in each of the upper and lower halves is bonded to a Zn atom proximate to one tetracoordinate O atom in the upper half; the Zn atom is bonded to a Ga atom proximate to one tetracoordinate O atom in each of the upper and lower halves through three tetracoordinate O atoms in the lower half with respect to the Zn atom; and the Ga atom is bonded to an In atom proximate to three tetracoordinate O atoms in each of the upper and lower halves through one tetracoordinate O atom in the lower half with respect to the Ga atom. A plurality of the medium groups are bonded to form a large group.

Figure 11B:
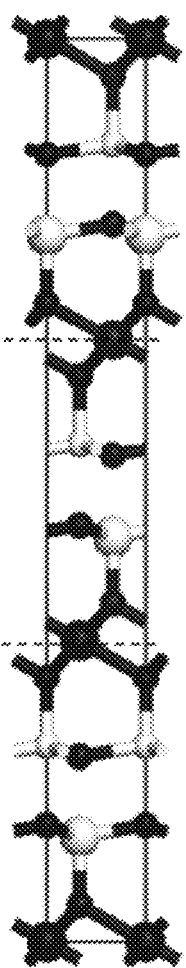
Figure 11C:
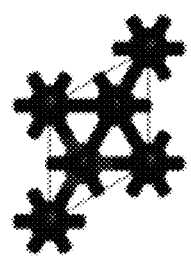

FIG. 11B illustrates a large group including three medium groups. FIG. 11C illustrates an atomic arrangement where the layered structure shown in FIG. 11B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a small group including any of the In atom, the Zn atom, and the Ga atom is 0. As a result, the total electric charge of a medium group having a combination of these small groups is always 0.

In order to form the layered structure of the In—Ga—Zn-based material, a large group can be formed using not only the medium group in FIG. 11A but also a medium group in which the arrangement of the In atom, the Ga atom, and the Zn atom is different from that in FIG. 11A.

Specifically, when the large group illustrated in FIG. 11B is repeated, an In—Ga—Zn-based crystal can be obtained. Note that a layered structure of the In—Ga—Zn-based crystal can be expressed as a composition formula, $InGaO_3(ZnO)_n$ (n is a natural number).

Figure 12A:
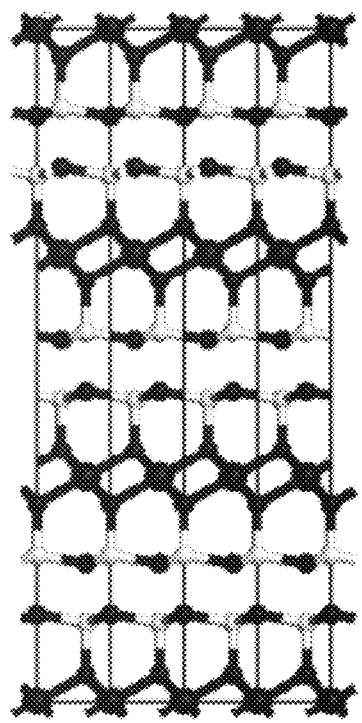
FIGS. 12A and 12B show crystal structures of oxide materials.

In the case of n=1 ($InGaZnO_4$), a crystal structure illustrated in FIG. 12A can be obtained, for example. Since Ga and In can have five ligands, as described with reference to FIG. 9B, the crystal structure can alternatively be a structure in which Ga in the crystal structure in FIG. 12A is replaced with In.

Figure 12B:
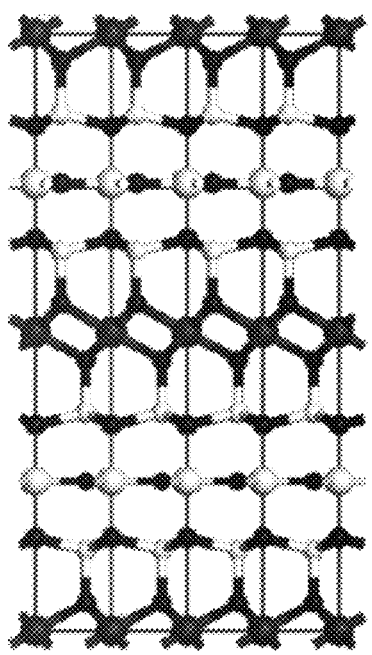

In the case of n=2 ($InGaZn_2O_5$), a crystal structure illustrated in FIG. 12B can be obtained, for example. Since Ga and In can have five ligands, as described with reference to FIG. 9B, the crystal structure can alternatively be a structure in which Ga in the crystal structure in FIG. 12B is replaced with In.

The above is the examples of the structure of the CAAC. An oxide semiconductor with crystallinity, such as the CAAC, has few defects in the bulk.

The regions 604*a*_a, 604*b*_a, 604*a*_b, and 604*b* b illustrated in FIGS. 8A and 8B are doped with the dopant and function as a source and a drain of the transistor. As the dopant, at least one of elements of Group 13 in the periodic table (e.g., boron), elements of Group 15 in the periodic table (e.g., one or more of nitrogen, phosphorus, and arsenic), and rare gas elements (e.g., one or more of helium, argon, and xenon) can be used, for example. A region functioning as a source of the transistor can be called source region, and a region functioning as a drain of the transistor can be called drain region. Addition of the dopant to the regions 604*a*_a, 604*b*_a, 604*a*_b, and 604*b*_b can reduce the resistance between the regions and the conductive layers; thus, the transistor can be downsized.

The conductive layers 605*a*_a, 605*b*_a, 605*a*_b, and 605*b* b function as the source or the drain of the transistor. Note that a layer functioning as a source of the transistor can be called source electrode or source wiring, and a layer functioning as a drain of the transistor can be called drain electrode or drain wiring.

The conductive layers 605*a*_a, 605*b*_a, 605*a*_b, and 605*b*_b can be formed using, for example, a layer of a metal material such as aluminum, magnesium, chromium, copper, tantalum, titanium, molybdenum, or tungsten or an alloy material containing any of the above metal materials as a main component. For example, the conductive layers 605*a*_a, 605*b*_a, 605*a*_b, and 605*b*_b can be formed using a layer of an alloy material containing copper, magnesium, and aluminum. Moreover, the conductive layers 605*a*_a, 605*b*_a, 605*a*_b, and 605*b* b can be a stack of materials applicable to these conductive layers. For example, the conductive layers 605*a*_a, 605*b*_a, 605*a*_b, and 605*b*_b can be formed using a stack including a layer of an alloy material containing copper, magnesium, and aluminum and a layer containing copper.

Alternatively, the conductive layers 605*a*_a, 605*b*_a, 605*a*_b, and 605*b*_b can be a layer containing a conductive metal oxide. Examples of the conductive metal oxide include indium oxide, tin oxide, zinc oxide, indium oxide-tin oxide, and indium oxide-zinc oxide. Note that silicon oxide may be contained in the conductive metal oxide applicable to the conductive layers 605*a*_a, 605*b*_a, 605*a*_b, and 605*b*_b.

As the insulating layers 606*a* and 606*b*, a layer of a material applicable to the insulating layers 602_a and 602_b can be used, for example. Alternatively, the insulating layers 606*a* and 606*b* can be formed using a stack of materials applicable to the insulating layers 606*a* and 606*b*.

The insulating layer 607 functions as a protective insulating layer for preventing impurities from entering the transistor.

As the insulating layer 607, a layer of a material applicable to the insulating layers 602_a and 602_b can be used, for example. Alternatively, the insulating layer 607 can be formed using a stack of materials applicable to the insulating layer 607. For example, insulating layer 607 may be formed using a silicon oxide layer, an aluminum oxide layer, or the like. For example, the use of an aluminum oxide layer as the insulating layer 607 can more effectively prevent impurities from entering the semiconductor layer 603_b and effectively prevent the semiconductor layer 603_b from releasing oxygen.

Note that the transistor in this embodiment may have a structure in which an insulating layer is provided over part of the oxide semiconductor layer serving as a channel formation layer and a conductive layer serving as a source or a drain is provided to overlap with the oxide semiconductor layer with the insulating layer placed therebetween. In that case, the insulating layer functions as a layer protecting the channel formation layer of the transistor (also referred to as channel protective layer). As the insulating layer functioning as a channel protective layer, a layer containing a material applicable to the insulating layers 602_a and 602_b can be used, for example. Alternatively, the insulating layer functioning as a channel protective layer may be a stack of materials applicable to the insulating layers 602_a and 602_b.

Further, base layers may be formed over the element formation layers 600_a and 600_b and the transistors may be formed over the base layers. In that case, the base layer can be a layer of a material applicable to the insulating layers 602_a and 602_b, for example. Alternatively, the base layer may be a stack of materials applicable to the insulating layers 602_a and 602_b. For example, a stack of an aluminum oxide layer and a silicon oxide layer used as the base layer can prevent oxygen in the base layer from being released through the semiconductor layers 603_a and 603_b.

Next, as an example of a method of manufacturing the transistor in this embodiment, an example of a method of manufacturing the transistor in FIG. 8A will be described with reference to FIGS. 13A to 13E. FIGS. 13A to 13E are schematic cross-sectional views illustrating a method of manufacturing the transistor.

Figure 13A:
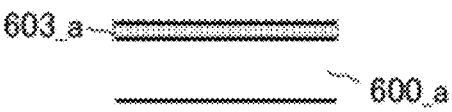
FIGS. 13A to 13E are cross-sectional schematic views showing an example of a method for manufacturing a transistor in Embodiment 5.

First, as illustrated in FIG. 13A, the element formation layer 600_a is prepared, and the semiconductor layer 603_a is formed over the element formation layer 600_a.

For example, a film of an oxide semiconductor material applicable to the semiconductor layer 603_a (such a film is also referred to as oxide semiconductor film) is formed by sputtering, thereby forming the semiconductor layer 603_a. Note that the oxide semiconductor film may be partly etched after the deposition. Moreover, the oxide semiconductor film may be formed in a rare gas atmosphere, an oxygen atmosphere, or a mixed atmosphere of a rare gas and oxygen.

The oxide semiconductor film may be formed using, as a sputtering target, an oxide target having a composition ratio of In:Ga:Zn=1:1:1, 4:2:3, 3:1:2, 1:1:2, 2:1:3, or 3:1:4 (in an atomic ratio). The oxide target having any of the above composition ratios enables formation of a highly crystalline oxide semiconductor film, and facilitates formation of polycrystals or CAACs.

In addition, the oxide semiconductor film may be formed using, as the sputtering target, an oxide target having a composition ratio of In:Sn:Zn=1:2:2, 2:1:3, 1:1:1, or 20:45:35 (in an atomic ratio). The oxide target having any of the above composition ratios enables formation of a highly crystalline oxide semiconductor film, and facilitates formation of polycrystals or CAACs.

Furthermore, an In—Zn-based oxide film may be formed using, as the sputtering target, an oxide target having a composition ratio of In:Zn=50:1 to 1:2 ($In_2O_3$:ZnO=25:1 to 1:4 in a molar ratio), preferably In:Zn=20:1 to 1:1 ($In_2O_3$:ZnO=10:1 to 1:2 in a molar ratio), further preferably In:Zn=15:1 to 1.5:1 ($In_2O_3$:ZnO=15:2 to 3:4 in a molar ratio). For example, when the atomic ratio of the target used for forming the In—Zn-based oxide semiconductor film is expressed by In:Zn:O=S:U:R, R>1.5S+U is satisfied. The increase in In content makes the field-effect mobility (also simply referred to as mobility) of the transistor higher.

In the case of using a sputtering method, the semiconductor layer 603_a is formed in a rare gas (typically argon) atmosphere, an oxygen atmosphere, or a mixed atmosphere of a rare gas and oxygen, for example. In that case, when the semiconductor layer 603_a is formed in a mixed atmosphere of a rare gas and oxygen, the oxygen content is preferably higher than the rare gas content.

When the film is formed by sputtering, it is preferable to sufficiently suppress leakage from the outside of a deposition chamber and degasification through an inner wall of the deposition chamber so that impurities such as hydrogen, water, a hydroxyl group, or hydride (also referred to as hydrogen compound) are not included in a deposited film.

For example, before the film is formed by sputtering, preheat treatment may be performed in a preheating chamber of a sputtering apparatus. By the preheat treatment, the above impurities can be eliminated.

Before the film is formed by sputtering, for example, it is possible to perform treatment by which voltage is applied to a substrate side, not to a target side, in an argon, nitrogen, helium, or oxygen atmosphere with the use of an RF power source and plasma is generated so that a surface of the substrate on which the film is to be formed is modified (such treatment is also referred to as reverse sputtering). With reverse sputtering, powdery substances (also referred to as particles or dust) attached to the surface where the film is to be formed can be removed.

In the case where the film is formed by sputtering, moisture remaining in the deposition chamber for forming the film can be removed by an entrapment vacuum pump or the like. As the entrapment vacuum pump, a cryopump, an ion pump, or a titanium sublimation pump can be used, for example. Alternatively, moisture remaining in the deposition chamber can be removed by a turbo molecular pump provided with a cold trap. With the use of the vacuum pump, back flow of the exhaust including the impurities can be reduced.

When a high-purity gas from which the above impurities are removed is used as a sputtering gas, for example, the impurity concentration of the deposited film can be lowered. For instance, a gas with a dew point of −70° C. or lower is preferably used as a sputtering gas.

The oxide semiconductor film may alternatively be formed by, instead of a sputtering method, an evaporation method, a plasma-enhanced chemical vapor deposition (PECVD) method, a pulsed laser deposition (PLD) method, an atomic layer deposition (ALD) method, a molecular beam epitaxy (MBE) method, or the like.

In the example of the method of manufacturing the transistor in this embodiment, a layer is formed by etching part of a film in the following manner, for instance: a resist mask is formed over part of the film by a photolithography process and the film is etched using the resist mask, thereby forming the layer. Note that in this case, the resist mask is removed after the layer is formed.

When an oxide semiconductor layer containing the CAAC is formed as the semiconductor layer 603_a, the oxide semiconductor film is formed by sputtering while the temperature of the element formation layer where the oxide semiconductor film is formed ranges from 100° C. to 600° C., preferably from 150° C. to 550° C., more preferably from 200° C. to 500° C. The oxide semiconductor film is deposited while the temperature of the element formation layer is high, whereby the impurity concentration in the film is reduced, the field-effect mobility of the transistor to be manufactured can be increased, and the gate-bias stress stability can be increased. Further, the atomic arrangement in the oxide semiconductor film is ordered, the density thereof is increased, so that a polycrystal or a CAAC is easily formed. Furthermore, since an oxygen gas atmosphere is employed for the deposition, an unnecessary atom is not contained in the film, so that a polycrystal or a CAAC is easily formed. Note that a mixed gas atmosphere including an oxygen gas and a rare gas may be used. In that case, the percentage of an oxygen gas is higher than or equal to 30 vol. %, preferably higher than or equal to 50 vol. %, more preferably higher than or equal to 80 vol. %. As the oxide semiconductor film is thinner, the short channel effect of the transistor can be reduced.

Here, the thickness of the oxide semiconductor layer ranges from 1 nm to 40 nm, preferably from 3 nm to 20 nm.

In that case, the element formation layer 600_a is preferably flat. For example, the average surface roughness of the element formation layer 600_a is preferably 1 nm or less, further preferably 0.3 nm or less. By increasing the flatness of the element formation layer 600_a, the mobility of the CAAC can be made higher than that of an amorphous oxide semiconductor. For example, the element formation layer 600_a can be flattened by at least one of chemical mechanical polishing (CMP) and plasma treatment. Here, plasma treatment includes treatment for performing sputtering on a surface with rare gas ions and treatment for performing etching on a surface with an etching gas.

Figure 13B:
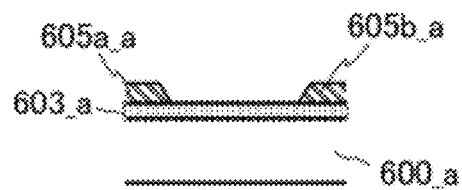

Then, as illustrated in FIG. 13B, the conductive layers 605*a*_a and 605*b*_a are formed over the semiconductor layer 603_a.

For example, a film of a material applicable to the conductive layers 605*a*_a and 605*b*_a is formed as a first conductive film by sputtering, and the first conductive film is partly etched, thereby forming the conductive layers 605*a*_a and 605*b*_a.

Figure 13C:
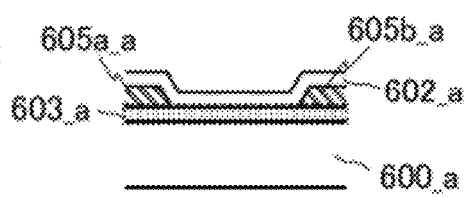

Next, as illustrated in FIG. 13C, the insulating layer 602_a is formed in contact with the semiconductor layer 603_a.

For example, the insulating layer 602_a can be formed by depositing a film applicable to the insulating layer 602_a by sputtering in a rare gas (typically argon) atmosphere, an oxygen atmosphere, or a mixed atmosphere of a rare gas and oxygen. The insulating layer 602_a formed by sputtering can suppress a reduction in the resistance of a portion of the semiconductor layer 603_a, which serves as a back channel of the transistor. The temperature of the element formation layer 600_a at the time when the insulating layer 602_a is formed preferably ranges from room temperature to 300° C.

Before the formation of the insulating layer 602_a, plasma treatment with the use of a gas such as $N_2O$, $N_2$, or Ar may be performed to remove water or the like adsorbed on an exposed surface of the semiconductor layer 603_a. In the case where the plasma treatment is performed, the insulating layer 602_a is preferably formed after the plasma treatment without exposure to air.

Figure 13D:
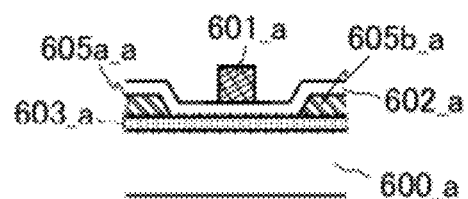

Next, as illustrated in FIG. 13D, the conductive layer 601_a is formed over the insulating layer 602_a.

For example, a film of a material applicable to the conductive layer 601_a is formed as a second conductive film by sputtering, and the second conductive film is partly etched, thereby forming the conductive layer 601_a.

Further, in the example of the method of manufacturing the transistor in FIG. 8A, heat treatment is performed, for example, at higher than or equal to 600° C. and lower than or equal to 750° C., or higher than or equal to 600° C. and lower than the strain point of the substrate. For example, the heat treatment is performed after the oxide semiconductor film is formed, after the oxide semiconductor film is partly etched, after the first conductive film is formed, after the first conductive film is partly etched, after the insulating layer 602_a is formed, after the second conductive film is formed, or after the second conductive film is partly etched. The heat treatment eliminates impurities such as hydrogen, water, a hydroxyl group, or hydride from the semiconductor layer 603_a.

Note that a heat treatment apparatus for the heat treatment can be an electric furnace or an apparatus for heating an object by heat conduction or heat radiation from a heater such as a resistance heater. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object by radiation of light (electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for heat treatment using a high-temperature gas. As the high-temperature gas, a rare gas or an inert gas (e.g., nitrogen) which does not react with the object by the heat treatment can be used.

Further, after the heat treatment is performed and while the heating temperature is being maintained or being decreased, a high-purity oxygen gas, a high-purity $N_2O$ gas, or ultra-dry air (having a dew point −40° C. or lower, preferably −60° C. or lower) may be introduced into the furnace where the heat treatment has been performed. It is preferable that the oxygen gas or the $N_2O$ gas do not contain water, hydrogen, and the like. The purity of the oxygen gas or the $N_2O$ gas which is introduced into the heat treatment apparatus is preferably 6N or higher, further preferably 7N or higher; that is, the impurity concentration of the oxygen gas or the $N_2O$ gas is preferably 1 ppm or lower, further preferably 0.1 ppm or lower. By the action of the oxygen gas or the $N_2O$ gas, oxygen is supplied to the semiconductor layer 603_a, and defects due to oxygen vacancy in the semiconductor layer 603_a can be reduced. Note that the high-purity oxygen gas, high-purity $N_2O$ gas, or ultra-dry air may be introduced during the heat treatment.

In the example of the method of manufacturing the transistor in FIG. 8A, oxygen may be implanted into the oxide semiconductor film with a method of accelerating oxygen ions by electric fields, such as oxygen doping using oxygen plasma, after the semiconductor layer 603_a is formed, after the conductive layers 605*a*_a and 605*b*_a are formed, after the insulating layer 602_a is formed, after the conductive layer 601_a is formed, or after the heat treatment is performed. For example, oxygen doping using a high-density plasma of 2.45 GHz may be performed. Alternatively, oxygen doping may be performed by an ion implantation method. The oxygen doping can reduce variations in electrical characteristics of transistors to be manufactured. For example, the oxygen doping is performed so that the insulating layer 602_a contains oxygen with a higher proportion than that in the stoichiometric composition.

When the insulating layer in contact with the semiconductor layer 603_a contains an excessive amount of oxygen, oxygen is easily supplied to the semiconductor layer 603_a.

Thus, oxygen defects in the semiconductor layer 603_a or at the interface between the insulating layer 602_a and the semiconductor layer 603_a can be reduced, which results in further reduction in the carrier concentration of the semiconductor layer 603_a. This embodiment is not limited to the above; even if an excessive amount of oxygen is contained in the semiconductor layer 603_a through the manufacturing process, the insulating layer in contact with the semiconductor layer 603_a can prevent oxygen from being released from the semiconductor layer 603_a.

For example, when an insulating layer containing gallium oxide is formed as the insulating layer 602_a, the composition of gallium oxide can be set to be $Ga_2O_x$ by supplying oxygen to the insulating layer.

When an insulating layer containing aluminum oxide is formed as the insulating layer 602_a, the composition of aluminum oxide can be set to be $Al_2O_x$ by supplying oxygen to the insulating layer.

Further, when an insulating layer containing gallium aluminum oxide or aluminum gallium oxide is formed as the insulating layer 602_a, the composition of gallium aluminum oxide or aluminum gallium oxide can be set to be $Ga_xAl_{2-x}O_3$ by supplying oxygen to the insulating layer.

Through the above steps, impurities such as hydrogen, water, a hydroxyl group, or hydride (hydrogen compound) are removed from the semiconductor layer 603_a and oxygen is supplied to the semiconductor layer 603_a; thus, the oxide semiconductor layer can be highly purified.

In addition to the heat treatment, after the insulating layer 602_a is formed, heat treatment (preferably at 200° C. to 600° C., for example, at 250° C. to 350° C.) may be performed in an inert gas atmosphere or an oxygen gas atmosphere.

The intended heating temperature of the element formation layer 600_a or the temperature of the heat treatment after the deposition is 150° C. or higher, preferably 200° C. or higher, further preferably 400° C. or higher. When the heat treatment after the oxide semiconductor film is deposited is performed at 300° C. or higher, impurities such as hydrogen contained in the film can be released and removed (the film can be dehydrated or dehydrogenated).

The heat treatment can be performed in an oxygen atmosphere; alternatively, the following two steps may be performed: the dehydration or dehydrogenation is performed in the above-described manner under a nitrogen atmosphere or a reduced pressure and then thermal treatment is performed in an oxygen atmosphere. By performing thermal treatment in an atmosphere including oxygen after the dehydration or dehydrogenation, oxygen can be added to the oxide semiconductor, so that the effect of the heat treatment can be further enhanced. Moreover, as the treatment for supplying oxygen, thermal treatment may be performed while the insulating layer is placed in contact with the oxide semiconductor layer. A defect due to oxygen vacancy is easily caused in the oxide semiconductor layer or at the interface between the oxide semiconductor layer and a layer stacked over the oxide semiconductor layer, for example; however, when excess oxygen is included in the oxide semiconductor by the heat treatment, oxygen vacancy caused constantly can be compensated for by excess oxygen. The excess oxygen is mainly oxygen existing between lattices. By setting the concentration of oxygen in the range of $1 \times 10^{16}/cm^3$ to $2 \times 10^{20}/cm^3$, oxygen can be included in the oxide semiconductor layer without causing crystal distortion or the like even if the oxide semiconductor layer is crystallized, for example.

The heat treatment performed after the formation of the oxide semiconductor film can increase the gate-bias stress stability of the transistor to be manufactured, and can increase the field-effect mobility of the transistor.

Figure 13E:
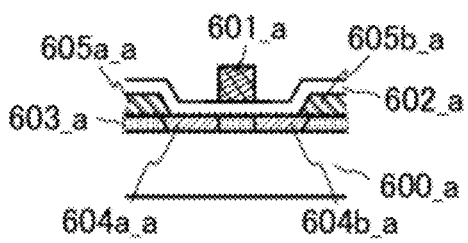

Then, as illustrated in FIG. 13E, a dopant is added to the semiconductor layer 603_a from a side on which the conductive layer 601_a is formed, so that the region 604a_a and the region 604b_a are formed in a self-aligned manner through the insulating layer 602_a.

For example, the dopant can be added by an ion doping apparatus or an ion implantation apparatus.

Although the example of the manufacturing method of the transistor illustrated in FIG. 8A is explained, the manufacturing method of the transistor of the present invention is not limited to the above. For example, if any of the components illustrated in FIG. 8B has the same designation as the components in FIG. 8A and has a function, at least part of which is the same as that of the components in FIG. 8A, the description of the example of the manufacturing method of the transistor in FIG. 8A can be employed as appropriate.

As described with reference to FIGS. 8A and 8B, FIGS. 9A to 9E, FIGS. 10A to 10C, FIGS. 11A to 11C, FIGS. 12A and 12B, and FIGS. 13A to 13E, each example of the transistor in this embodiment includes a conductive layer functioning as a gate; an insulating layer functioning as a gate insulating layer; an oxide semiconductor layer in which a channel is formed and which overlaps with the conductive layer functioning as the gate with the insulating layer functioning as the gate insulating layer placed therebetween; a conductive layer that is electrically connected to the oxide semiconductor layer and functions as one of a source and a drain; and a conductive layer that is electrically connected to the oxide semiconductor layer and functions as the other of the source and the drain.

In the transistor in the example of this embodiment, the carrier concentration of the oxide semiconductor layer can be lower than $1 \times 10^{14}/cm^3$, preferably lower than $1 \times 10^{12}/cm^3$, further preferably lower than $1 \times 10^{11}/cm^3$.

The carrier density of an oxide semiconductor applied to the transistor is preferably $1 \times 10^{18}/cm^3$ or lower. An oxide semiconductor containing In or Zn can have a carrier density of $1 \times 10^{18}/cm^3$ or lower by performing high purification of the oxide semiconductor film (removal of hydrogen and the like) or heat treatment after the deposition as described above, as well as by containing Ga or Sn as its component.

By performing at least one of the heat treatment during the deposition of the oxide semiconductor film and the heat treatment after the deposition, the threshold voltage of the transistor can be positively shifted to make the transistor normally off, and the off-state current per micrometer of channel width can be 10 aA ($1 \times 10^{-17}$ A) or less, 1 aA ($1 \times 10^{-18}$ A) or less, 10 zA ($1 \times 10^{-20}$ A) or less, 1 zA ($1 \times 10^{-21}$ A) or less, and even 100 yA ($1 \times 10^{-22}$ A) or less. It is preferable that the off-state current of the transistor be as low as possible; the lower limit of the off-state current of the transistor in this embodiment is estimated to be about $10^{-30}$ A/μm.

With the use of the transistor including the oxide semiconductor layer in this embodiment as the transistor which controls writing and holding of data in any of the memory devices in the above embodiments for example, a data retention period of the memory device can be prolonged.

The transistor in the example of this embodiment and another transistor, for example, a transistor including a semiconductor layer containing a semiconductor belonging to Group 14 of the periodic table (e.g., silicon) can be stacked. Thus, the circuit area can be reduced while the transistor including the oxide semiconductor layer and the another transistor can be formed over one substrate.

The transistor including the oxide semiconductor can have relatively high field-effect mobility regardless of whether the oxide semiconductor is amorphous or crystalline. Such an increase in field-effect mobility might be attributed not only to removal of impurities by dehydration or dehydrogenation but also to a reduction in interatomic distance due to an increase in density. For example, the field-effect mobility of a transistor including an In—Sn—Zn-based oxide semiconductor can be higher than 31 cm$^2$/Vsec, preferably higher than 39 cm$^2$/Vsec, further preferably higher than 60 cm$^2$/Vsec. It has been proposed that ideally, a highly purified oxide semiconductor can achieve a field-effect mobility exceeding 100 cm$^2$/Vsec. In addition, the example of the transistor in this embodiment indicates that the field-effect mobility thereof is increased as the defect density of the oxide semiconductor layer decreases.

(Embodiment 6)

In this embodiment, an example of an arithmetic processing unit such as a CPU will be described.

The example of the arithmetic processing unit in this embodiment is described with reference to FIG. 14.

Figure 14:
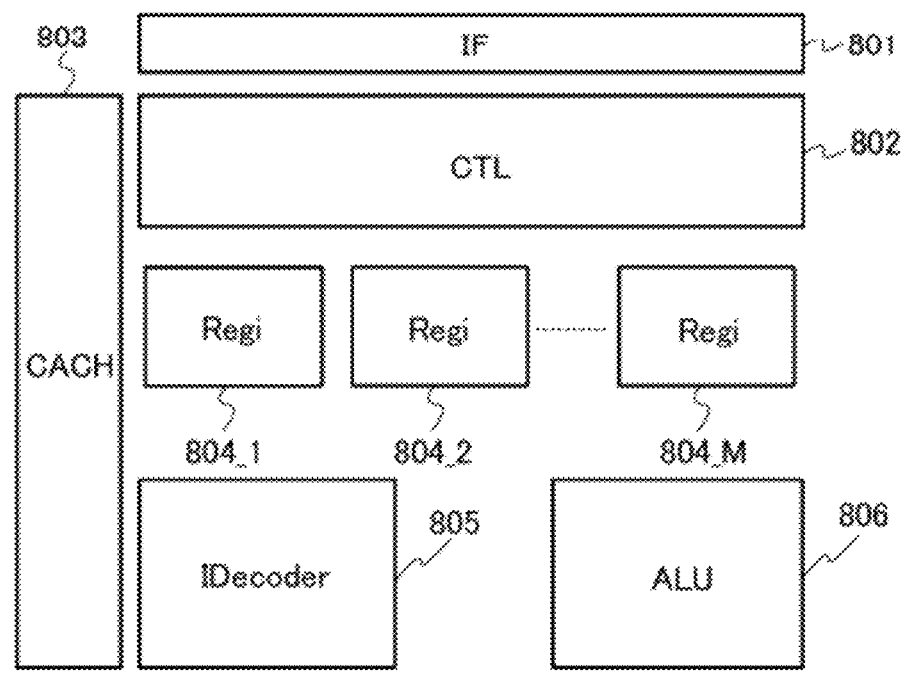
FIG. 14 illustrates an example of an arithmetic processing unit in Embodiment 6.

The arithmetic processing unit illustrated in FIG. 14 includes a bus interface (also referred to as an IF) 801, a control unit (also referred to as a CTL) 802, a cache memory (also referred to as a CACH) 803, M (M is a natural number greater than or equal to 3) registers (also referred to as Regis) 804 (registers 804_1 to 804_M), an instruction decoder (also referred to as an IDecoder) 805, and an arithmetic logic unit (also referred to as an ALU) 806.

The bus interface 801 has a function of exchanging signals with the external of the arithmetic processing unit and a function of exchanging signals with circuits in the arithmetic processing unit, and the like.

The control unit 802 has a function of controlling operations of the circuits in the arithmetic processing unit.

For example, the control unit 802 can include the integrated circuit in any of the above embodiments.

The cache memory 803 is controlled by the control unit 802 and has a function of temporarily holding data during the operation of the arithmetic processing unit. Note that the arithmetic processing unit may include a plurality of cache memories 803 as a primary cache and a secondary cache, for example.

For example, the memory device in the above embodiment can be used for the cache memory 803 as a content addressable memory.

The M registers 804 are controlled by the control unit 802 and each have a function of storing data used for arithmetic processing. For example, one register 804 may be used as a register for the arithmetic logic unit 806 and another register 804 may be used as a register for the instruction decoder 805.

The instruction decoder 805 has a function of translating an instruction signal which is read. The translated instruction signal is input to the control unit 802, and the control unit 802 outputs a control signal in accordance with the instruction signal to the arithmetic logic unit 806.

The arithmetic logic unit 806 is controlled by the control unit 802 and has a function of performing logical arithmetic operation in accordance with the input instruction signal.

As described with reference to FIG. 14, the memory device described in the above embodiment is used for the cache memory in the example of the arithmetic processing unit in this embodiment; thus, the cache memory can be equipped with a function of selecting whether to output data stored in the cache memory in accordance with search data.

In the arithmetic processing unit in this embodiment, even when the supply of the power supply voltage is stopped, part of internal data in the state at the time just before the supply of the power supply voltage is stopped can be retained in the cache memory, and when the supply of the power supply voltage restarts, the state of the arithmetic processing unit can be returned to the state at the time just before the supply of the power supply voltage is stopped. Accordingly, even when power consumption is reduced by selectively stopping the supply of the power supply voltage, a time after the supply of the power supply voltage restarts until the normal operation starts can be shortened.

(Embodiment 7)

In this embodiment, examples of electronic devices each including the arithmetic processing unit in the above embodiment are described.

Structural examples of the electronic devices according to this embodiment will be described with reference to FIGS. 15A to 15D.

Figure 15A:
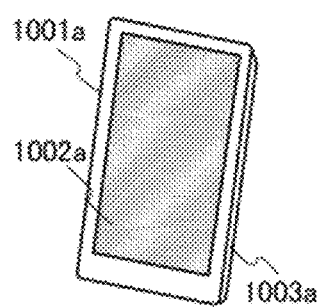
FIGS. 15A to 15D illustrate examples of electronic devices in Embodiment 7.

An electronic device in FIG. 15A is an example of a portable information terminal. The portable information terminal in FIG. 15A includes a housing 1001a and a display portion 1002a provided in the housing 1001a.

Note that a side surface 1003a of the housing 1001a may be provided with a connection terminal for connecting the portable information terminal in FIG. 15A to an external device and/or a button used to operate the portable information terminal.

In the housing 1001a of the portable information terminal illustrated in FIG. 15A, a CPU, a memory circuit, an interface with which signals are transmitted and received between the external device and each of the CPU and the memory circuit, and an antenna which transmits and receives signals to/from the external device are provided.

The portable information terminal illustrated in FIG. 15A has a function of one or more of a telephone set, an electronic book, a personal computer, and a game machine.

Figure 15C:
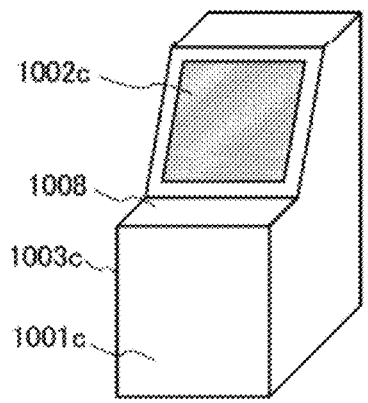
Figure 15B:
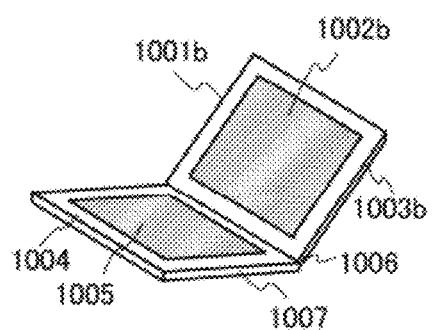

An electronic device in FIG. 15B is an example of a folding portable information terminal The portable information terminal illustrated in FIG. 15B includes a housing 1001b, a display portion 1002b provided in the housing 1001b, a housing 1004, a display portion 1005 provided in the housing 1004, and a hinge 1006 for connecting the housing 1001b and the housing 1004.

In the portable information terminal in FIG. 15B, the housing 1001b can be stacked on the housing 1004 by moving the housing 1001b or the housing 1004 with the hinge 1006.

Note that a side surface 1003b of the housing 1001b or a side surface 1007 of the housing 1004 may be provided with a connection terminal for connecting the portable information terminal in FIG. 15B to an external device and/or a button used to operate the portable information terminal.

The display portion 1002b and the display portion 1005 may display different images or one image. Note that the display portion 1005 is not necessarily provided, and a keyboard which is an input device may be provided instead of the display portion 1005.

The portable information terminal illustrated in FIG. 15B includes a CPU, a memory circuit, and an interface for transmitting and receiving signals between the external device and each of the CPU and the memory circuit, in the housing 1001b or the housing 1004. Note that the portable information terminal in FIG. 15B may be further provided with an antenna which transmits and receives signals to/from the external device.

The portable information terminal illustrated in FIG. 15B has a function of one or more of a telephone set, an electronic book, a personal computer, and a game machine.

The electronic device in FIG. 15C is an example of a stationary information terminal The stationary information terminal illustrated in FIG. 15C includes a housing 1001c and a display portion 1002c provided in the housing 1001c.

Note that the display portion 1002c may be provided on a deck portion 1008 of the housing 1001c.

The stationary information terminal illustrated in FIG. 15C includes a CPU, a memory circuit, and an interface for transmitting and receiving signals between the external device and each of the CPU and the memory circuit, in the housing 1001c. Note that the stationary information terminal in FIG. 15C may be further provided with an antenna which transmits and receives signals to/from the external device.

Further, a side surface 1003c of the housing 1001c in the stationary information terminal in FIG. 15C may be provided with one or more parts selected from a ticket ejection portion that ejects a ticket or the like, a coin slot, and a bill slot.

The stationary information terminal in FIG. 15C serves, for examples, as an automated teller machine, an information communication terminal for ticketing or the like (also referred to as a multi-media station), or a game machine.

Figure 15D:
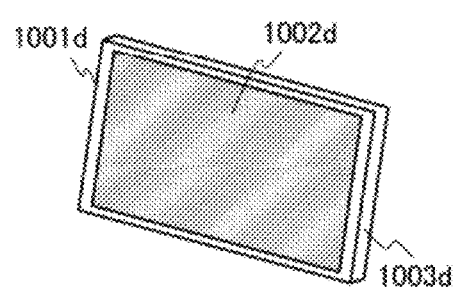

FIG. 15D illustrates an example of a stationary information terminal. The stationary information terminal in FIG. 15D includes a housing 1001d and a display portion 1002d provided in the housing 1001d. Note that a support for supporting the housing 1001d may also be provided.

Note that a side surface 1003d of the housing 1001d may be provided with a connection terminal for connecting the stationary information terminal in FIG. 15D to an external device and/or a button used to operate the stationary information terminal.

The stationary information terminal illustrated in FIG. 15D includes a CPU, a memory circuit, and an interface for transmitting and receiving signals between the external device and each of the CPU and the memory circuit, in the housing 1001d. Note that the stationary information terminal illustrated in FIG. 15D may be provided with an antenna which transmits and receives signals to/from the external device.

The stationary information terminal in FIG. 15D serves, for example, as a digital photo frame, a monitor, or a television set.

The arithmetic processing unit according to the above embodiment is used as each of the CPUs in the electronic devices illustrated in FIGS. 15A to 15D.

As described with reference to FIGS. 15A to 15D, the examples of the electronic devices according to this embodiment each include the arithmetic processing unit according to the above embodiment as the CPU.

Further, in the electronic devices exemplified in this embodiment, the arithmetic processing unit in the above embodiment allows the data to be held for a long time while saving power. Accordingly, the power consumption of the arithmetic processing unit can be reduced.

This application is based on Japanese Patent Application serial no. 2011-128974 filed with Japan Patent Office on Jun. 9, 2011, the entire contents of which are hereby incorporated by reference.

What is claimed is:

1. A memory device comprising:
a memory cell, a first data signal line, and a second data signal line, the memory cell comprising:
a first transistor comprising a first gate, a first source, and a first drain;
a second transistor comprising a second source, a second drain, and a second gate;
a third transistor comprising a third source, a third drain, and a third gate;
a fourth transistor comprising a fourth source, a fourth drain, and a fourth gate;
a fifth transistor comprising a fifth source, a fifth drain, and a fifth gate;
a sixth transistor comprising a sixth source, a sixth drain, and a sixth gate; and
a seventh transistor comprising a seventh source, a seventh drain, and a seventh gate,
wherein one of the first source and the first drain is electrically connected to the first data signal line,
wherein the first transistor has an off-state current per micrometer of channel width of lower than or equal to 10 aA,
wherein one of the second source and the second drain is electrically connected to the first data signal line,
wherein the second gate is electrically connected to the other of the first source and the first drain,
wherein the third transistor has a conductivity type opposite to that of the second transistor,
wherein one of the third source and the third drain is electrically connected to the second data signal line,
wherein the other of the third source and the third drain is electrically connected to the other of the second source and the second drain,
wherein the third gate is electrically connected to the other of the first source and the first drain,
wherein the fourth gate is electrically connected to the other of the second source and the second drain, and the other of the third source and the third drain,
wherein one of the fifth source and the fifth drain is electrically connected to the first data signal line,
wherein the fifth gate is electrically connected to the other of the first source and the first drain,
wherein the sixth transistor has a conductivity type opposite to that of the fifth transistor,
wherein one of the sixth source and the sixth drain is electrically connected to the other of the fifth source and the fifth drain,
wherein the sixth gate is electrically connected to the other of the first source and the first drain, and
wherein the seventh gate is electrically connected to the other of the fifth source and the fifth drain and one of the sixth source and the sixth drain.

2. The memory device according to claim 1, wherein the first transistor includes an oxide semiconductor layer in which a channel is formed.

3. The memory device according to claim 1, wherein the memory device is incorporated in one selected from the group consisting of a portable information terminal and a stationary information terminal.

4. A memory device comprising:
a memory cell, a first data signal line, a second data signal line, and a selection signal line, the memory cell comprising:
a first transistor comprising a first source, a first drain, and a first gate;
a second transistor comprising a second source, a second drain, and a second gate;
a third transistor comprising a third source, a third drain, and a third gate;
a fourth transistor comprising a fourth source, a fourth drain, and a fourth gate;
a fifth transistor comprising a fifth source, a fifth drain, and a fifth gate;
a sixth transistor comprising a sixth source, a sixth drain, and a sixth gate; and
a seventh transistor comprising a seventh source, a seventh drain, and a seventh gate, wherein one of the first source and the first drain is electrically connected to the first data signal line, wherein the first gate is electrically connected to the selection signal line, wherein the first transistor has an off-state current per micrometer of channel width of lower than or equal to 10 aA, wherein one of the second source and the second drain is electrically connected to the first data signal line, wherein the second gate is electrically connected to the other of the first source and the first drain, wherein the third transistor has a conductivity type opposite to that of the second transistor, wherein one of the third source and the third drain is electrically connected to the second data signal line, wherein the other of the third source and the third drain is electrically connected to the other of the second source and the second drain, wherein the third gate is electrically connected to the other of the first source and the first drain, wherein the fourth gate is electrically connected to the other of the second source and the second drain, and the other of the third source and the third drain, wherein one of the fifth source and the fifth drain is electrically connected to the first data signal line, wherein the fifth gate is electrically connected to the other of the first source and the first drain, wherein the sixth transistor has a conductivity type opposite to that of the fifth transistor, wherein one of the sixth source and the sixth drain is electrically connected to the other of the fifth source and the fifth drain, wherein the sixth gate is electrically connected to the other of the first source and the first drain, and wherein the seventh gate is electrically connected to the other of the fifth source and the fifth drain and one of the sixth source and the sixth drain.

5. The memory device according to claim 1, wherein the first transistor includes an oxide semiconductor layer in which a channel is formed.

6. The memory device according to claim 4, wherein the memory device is incorporated in one selected from the group consisting of a portable information terminal and a stationary information terminal.

\* \* \* \* \*